US011925082B2

(12) United States Patent
Li et al.

(10) Patent No.: US 11,925,082 B2
(45) Date of Patent: Mar. 5, 2024

(54) DISPLAY PANEL AND DISPLAY DEVICE

(71) Applicant: BOE TECHNOLOGY GROUP CO., LTD., Beijing (CN)

(72) Inventors: Mei Li, Beijing (CN); Tian Dong, Beijing (CN); Li Wang, Beijing (CN); Guangliang Shang, Beijing (CN); Can Zheng, Beijing (CN)

(73) Assignee: BOE TECHNOLOGY GROUP, CP., LTD., Beijing (CN)

( * ) Notice: Subject to any disclaimer, the term of this patent is extended or adjusted under 35 U.S.C. 154(b) by 90 days.

(21) Appl. No.: 17/621,861

(22) PCT Filed: Jan. 19, 2021

(86) PCT No.: PCT/CN2021/072707
§ 371 (c)(1),
(2) Date: Dec. 22, 2021

(87) PCT Pub. No.: WO2022/141681
PCT Pub. Date: Jul. 7, 2022

(65) Prior Publication Data
US 2023/0154401 A1 May 18, 2023

(51) Int. Cl.
H10K 59/131 (2023.01)
G09G 3/3233 (2016.01)
(Continued)

(52) U.S. Cl.
CPC ......... *H10K 59/131* (2023.02); *G09G 3/3233* (2013.01); *G09G 3/3266* (2013.01);
(Continued)

(58) Field of Classification Search
CPC .... H10K 59/12; H10K 59/131; H10K 59/353; H10K 59/1201; H10K 59/121;
(Continued)

(56) References Cited

U.S. PATENT DOCUMENTS 8,405,086 B1 * 3/2013 Hou .................. G02F 1/136227
257/88
8,822,987 B2 9/2014 Fujita et al.
(Continued)

FOREIGN PATENT DOCUMENTS

CN 103137068 A 6/2013
CN 104064581 A 9/2014
(Continued)

OTHER PUBLICATIONS

International Search Report of PCT/CN2021/072707 in Chinese, dated Sep. 29, 2021.
(Continued)

*Primary Examiner* — Nitin Patel
*Assistant Examiner* — Amen W Bogale
(74) *Attorney, Agent, or Firm* — Collard & Roe, P.C.; William Collard

(57) ABSTRACT

A display panel and a display device are provided. The display panel includes: a pixel unit including a pixel circuit and a light-emitting element, the pixel circuit including a first transistor, the pixel unit including a first pixel unit and a second pixel unit located in a same row and adjacent columns; a first gate line and a second gate line, connected to gate electrodes of the first transistors of the first pixel unit and the second pixel unit; a first gate signal line, connected to the first pixel unit; a second gate signal line, connected to the second pixel unit; a first connection line connected with the first gate signal line through the first connection line; and a second connection line connected with the second gate signal line through the second connection line.

21 Claims, 13 Drawing Sheets

(51) Int. Cl.
*G09G 3/3266* (2016.01)
*G09G 3/3275* (2016.01)
*H10K 59/121* (2023.01)
*H10K 102/00* (2023.01)

(52) U.S. Cl.
CPC ......... *G09G 3/3275* (2013.01); *H10K 59/121* (2023.02); *G09G 2300/0426* (2013.01); *G09G 2300/0819* (2013.01); *G09G 2300/0842* (2013.01); *G09G 2300/0861* (2013.01); *G09G 2320/0214* (2013.01); *G09G 2320/0247* (2013.01); *G09G 2330/02* (2013.01); *G09G 2330/021* (2013.01); *H10K 2102/302* (2023.02)

(58) Field of Classification Search
CPC ........... H10K 59/1216; H10K 59/1213; H10K 59/123; G09G 2300/0426; G09G 3/3233; G09G 2300/0842; G09G 2300/0819; G09G 2310/0251; G09G 2310/0262; G09G 2320/0223; H01L 27/124
See application file for complete search history.

(56) References Cited

U.S. PATENT DOCUMENTS

| | | | |
|---|---|---|---|
| 9,196,195 B2 | 11/2015 | Tamura et al. | |
| 9,952,478 B2 | 4/2018 | Hong et al. | |
| 10,062,743 B2 | 8/2018 | Lee et al. | |
| 10,403,704 B2 | 9/2019 | Chae | |
| 10,431,604 B2 | 10/2019 | Cho et al. | |
| 10,510,822 B2 | 12/2019 | Kim et al. | |
| 10,971,073 B2 | 4/2021 | Kumura | |
| 11,062,652 B1 | 7/2021 | Zhou et al. | |
| 11,176,883 B2 | 11/2021 | Na et al. | |
| 11,195,893 B2 | 12/2021 | Lee et al. | |
| 11,257,432 B2 | 2/2022 | Yuan et al. | |
| 2009/0303164 A1 | 12/2009 | Kajiyama et al. | |
| 2015/0355517 A1* | 12/2015 | Huang | G02F 1/1368 257/72 |
| 2016/0210905 A1 | 7/2016 | Lee et al. | |
| 2017/0179165 A1 | 6/2017 | Lan | |
| 2017/0365206 A1* | 12/2017 | Kim | G09G 3/20 |
| 2018/0082648 A1* | 3/2018 | Xu | G09G 3/2074 |
| 2019/0088209 A1 | 3/2019 | Kang et al. | |
| 2020/0052053 A1 | 2/2020 | Song et al. | |
| 2020/0066825 A1 | 2/2020 | Yang et al. | |
| 2020/0105849 A1 | 4/2020 | Kim et al. | |
| 2020/0168147 A1 | 5/2020 | Na et al. | |
| 2022/0102459 A1 | 3/2022 | Yang et al. | |
| 2023/0157098 A1 | 5/2023 | Wang et al. | |

FOREIGN PATENT DOCUMENTS

| | | |
|---|---|---|
| CN | 105093731 A | 11/2015 |
| CN | 106449651 A | 2/2017 |
| CN | 106952940 A | 7/2017 |
| CN | 107369690 A | 11/2017 |
| CN | 108565269 U | 9/2018 |
| CN | 108878476 A | 11/2018 |
| CN | 109698225 A | 4/2019 |
| CN | 110335564 A | 10/2019 |
| CN | 110970469 A | 4/2020 |
| CN | 110992880 A | 4/2020 |
| CN | 111048041 A | 4/2020 |
| CN | 111095387 A | 5/2020 |
| CN | 111243510 A | 6/2020 |
| CN | 210667751 U | 6/2020 |
| CN | 111508977 A | 8/2020 |
| CN | 111681549 A | 9/2020 |
| CN | 111951729 A | 11/2020 |
| CN | 112017593 A | 12/2020 |
| CN | 112071268 A | 12/2020 |
| KR | 10-2015-0062692 A | 6/2015 |

OTHER PUBLICATIONS

Written Opinion of the International Searching Authority of PCT/CN2021/072707 in Chinese, dated Sep. 29, 2021.
International Search Report of PCT/CN2020/140199 in Chinese, dated Sep. 28, 2021.
Written Opinion of the International Searching Authority of PCT/CN2020/140199 in Chinese, dated Sep. 28, 2021.
International Search Report of PCT/CN2021/072695 in Chinese, dated Sep. 28, 2021.
Written Opinion of the International Searching Authority of PCT/CN2021/072695 in Chinese, dated Sep. 28, 2021.
U.S. Office Action in U.S. Appl. No. 17/621,770 dated Jun. 7, 2023.
U.S. Office Action in U.S. Appl. No. 17/615,950 dated Jul. 18, 2023.

* cited by examiner

DISPLAY PANEL AND DISPLAY DEVICE

CROSS REFERENCE TO RELATED APPLICATIONS

This application is a U.S. National Phase Entry of International Application No. PCT/CN2021/072707 filed on Jan. 19, 2021, designating the United States of America and claiming priority to International Application No. PCT/CN2020/140199, filed on Dec. 28, 2020. The present application claims priority to and the benefit of the above-identified applications and the above-identified applications are incorporated by reference herein in their entirety.

TECHNICAL FIELD

Embodiments of the present disclosure relate to a display panel and a display device.

BACKGROUND

With the continuous development of display technology, active-matrix organic light-emitting diode (AMOLED) display technology has been more and more used in mobile phones, tablet computers, digital cameras and other display devices because of its advantages of self-illumination, wide viewing angle, high contrast, low power consumption and high response speed.

SUMMARY

At least one embodiment of the disclosure provides a display panel and a display device.

At least one embodiment of the disclosure provides a display panel comprising: a pixel unit, comprising a pixel circuit and a light-emitting element, wherein the pixel circuit is configured to drive the light-emitting element, the pixel circuit comprises a first transistor, the pixel unit comprises a first pixel unit and a second pixel unit located in a same row and adjacent columns; a first gate line, connected to a gate electrode of the first transistor of the first pixel unit; a second gate line, connected to the gate electrode of the first transistor of the second pixel unit; a first gate signal line, extending along a first direction, connected to the first pixel unit and configured to provide a first scanning signal to the first pixel unit; a second gate signal line, extending along the first direction, connected to the second pixel unit and configured to provide a second scanning signal to the second pixel unit; a first connection line, extending along the second direction, wherein the first gate line is connected with the first gate signal line through the first connection line; and a second connection line, extending along the second direction, wherein the second gate line is connected with the second gate signal line through the second connection line, and the second direction intersects with the first direction.

For example, in some embodiments of the disclosure, the first gate signal line and the second gate signal line are insulated from each other.

For example, in some embodiments of the disclosure, the first gate line and the second gate line are separated from each other and arranged along the first direction.

For example, in some embodiments of the disclosure, the second gate signal line is closer to the first gate line than the first gate signal line.

For example, in some embodiments of the disclosure, orthographic projections of the first gate signal line and the second gate signal line on the base substrate do not overlap with an orthographic projection of a channel region of the first transistor on the base substrate.

For example, in some embodiments of the disclosure, the first gate line, the first connection line and the first gate signal line are located in three different layers, and the second gate line, the second connection line and the second gate signal line are located in three different layers.

For example, in some embodiments of the disclosure, the first gate line and the second gate line are located in the same layer, the first connection line and the second connection line are located in the same layer, and the first gate signal line and the second gate signal line are located in the same layer.

For example, in some embodiments of the disclosure, the first gate line and the second gate line are located in a first conductive pattern layer; the first gate signal line and the second gate signal line are located in a second conductive pattern layer; the first connection line and the second connection line are located in a third conductive pattern layer; the first conductive pattern layer is closer to the base substrate than the second conductive pattern layer, and the second conductive pattern layer is closer to the base substrate than the third conductive pattern layer.

For example, in some embodiments of the disclosure, the display panel further comprises a first gate insulating layer, a second gate insulating layer and an interlayer insulating layer, wherein the first conductive pattern layer is located on the first gate insulating layer, the second gate insulating layer is arranged between the first conductive pattern layer and the second conductive pattern layer, the interlayer insulating layer is located on the second conductive pattern layer, and the third conductive pattern layer is located on the interlayer insulating layer; one end of the first connection line is connected to the first gate line through a first via hole penetrating the second gate insulating layer and the interlayer insulating layer, and the other end of the first connection line is connected to the first gate signal line through a second via hole penetrating the interlayer insulating layer; one end of the second connection line is connected to the second gate line through a third via hole penetrating the second gate insulating layer and the interlayer insulating layer, and the other end of the second connection line is connected to the second gate signal line through a fourth via hole penetrating the interlayer insulating layer.

For example, in some embodiments of the disclosure, the pixel circuit further comprises a driving transistor and a second transistor; a gate electrode of the second transistor of the first pixel unit is connected to the first gate line, and the gate electrode of the second transistor of the second pixel unit is connected to the second gate line, a first electrode of the second transistor is connected with a second electrode of the driving transistor, and a second electrode of the second transistor is connected with a gate electrode of the driving transistor.

For example, in some embodiments of the disclosure, the display panel further comprises a first power supply terminal and a data line, wherein the first power supply terminal is configured to provide a first voltage signal to the pixel circuit, and the data line is configured to provide a data signal to the pixel circuit; wherein the pixel circuit further comprises a storage capacitor; a first electrode of the first transistor is connected with the data line, and a first electrode of the driving transistor is connected with a second electrode of the first transistor; a first electrode of the storage capacitor is connected with the gate electrode of the driving transistor, and a second electrode of the storage capacitor is connected with the first power supply terminal.

For example, in some embodiments of the disclosure, orthographic projections of the first gate signal line and the second gate signal line on the base substrate do not overlap with an orthographic projection of a channel region of the second transistor on the base substrate.

For example, in some embodiments of the disclosure, the display panel further comprises an initialization signal line, wherein the initialization signal line is configured to provide an initialization signal to the pixel circuit, the pixel circuit further comprises a first reset transistor; a first electrode of the first reset transistor is connected to the initialization signal line, and a second electrode of the first reset transistor is connected to the gate electrode of the driving transistor.

For example, in some embodiments of the disclosure, the first gate signal line and the second gate signal line are located between the second transistor and the first reset transistor.

For example, in some embodiments of the disclosure, the pixel unit further comprises a third pixel unit located in the same column as the first pixel unit, and the data line comprises a first data line, a second data line and a third data line, the first data line is connected to the first pixel unit, the second data line is connected to the second pixel unit and the third data line is connected to the third pixel unit.

For example, in some embodiments of the disclosure, the pixel unit further comprises a fourth pixel unit located in the same column as the second pixel unit, and the data line comprises a fourth data line connected to the fourth pixel unit.

For example, in some embodiments of the disclosure, the display panel further comprises a connection element, wherein the light-emitting element is connected to the pixel circuit through the connection element, and the connection element comprises a shielding portion extending along the second direction; the data line and the shielding portion are located in the same layer, and the data line comprises two adjacent data lines, and the shielding portion is located between the two adjacent data lines, and an orthographic projection of the first connection line on the base substrate does not overlap with an orthographic projection of the shielding portion on the base substrate.

For example, in some embodiments of the disclosure, the pixel circuit comprises a driving transistor and a second transistor, a first electrode of the second transistor is connected with a second electrode of the driving transistor, and a second electrode of the second transistor is connected with a gate electrode of the driving transistor; the display panel further comprises a third connection line, the gate electrode of the driving transistor is connected with the second electrode of the second transistor through the third connection line, an area of an orthographic projection of the shielding portion on the base substrate is larger than an area of an orthographic projection of the third connection line on the base substrate.

For example, in some embodiments of the disclosure, an orthographic projection of the gate electrode of the driving transistor on the base substrate overlaps with an orthographic projection of the shielding portion on the base substrate, and an area of an overlapping portion of the shielding portion and the gate electrode of the driving transistor is smaller than an area of the gate electrode of the driving transistor.

For example, in some embodiments of the disclosure, a size of the gate electrode of the driving transistor in the first direction is larger than a size of the shielding portion in the first direction; a size of the shielding portion in the second direction is larger than a size of the gate electrode of the driving transistor in the second direction.

For example, in some embodiments of the disclosure, the orthographic projection of the shielding portion on the base substrate overlaps with the orthographic projection of the first gate line or the second gate line on the base substrate.

At least one embodiment of the disclosure provides a display device comprising any display panel as mentioned above.

BRIEF DESCRIPTION OF THE DRAWINGS

In order to more clearly explain the technical solution of the embodiments of the present disclosure, drawings of the embodiments will be briefly introduced in the following. Obviously, the drawings in the following description only relate to some embodiments of the present disclosure, but not limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

The dual gate and dual source (Dual gate & Dual source) technical solutions can solve the problem of insufficient compensation time in high-frequency display. However, in the application of high-resolution display devices, this solution has the limitation of pixel layout space and the problem of parasitic capacitance between the signal lines.

At present, there is a great demand for high frame rate AMOLED display panels in the market. For example, a dual data scheme can achieve 120 Hz driving while ensuring the display effect.

Figure 1:
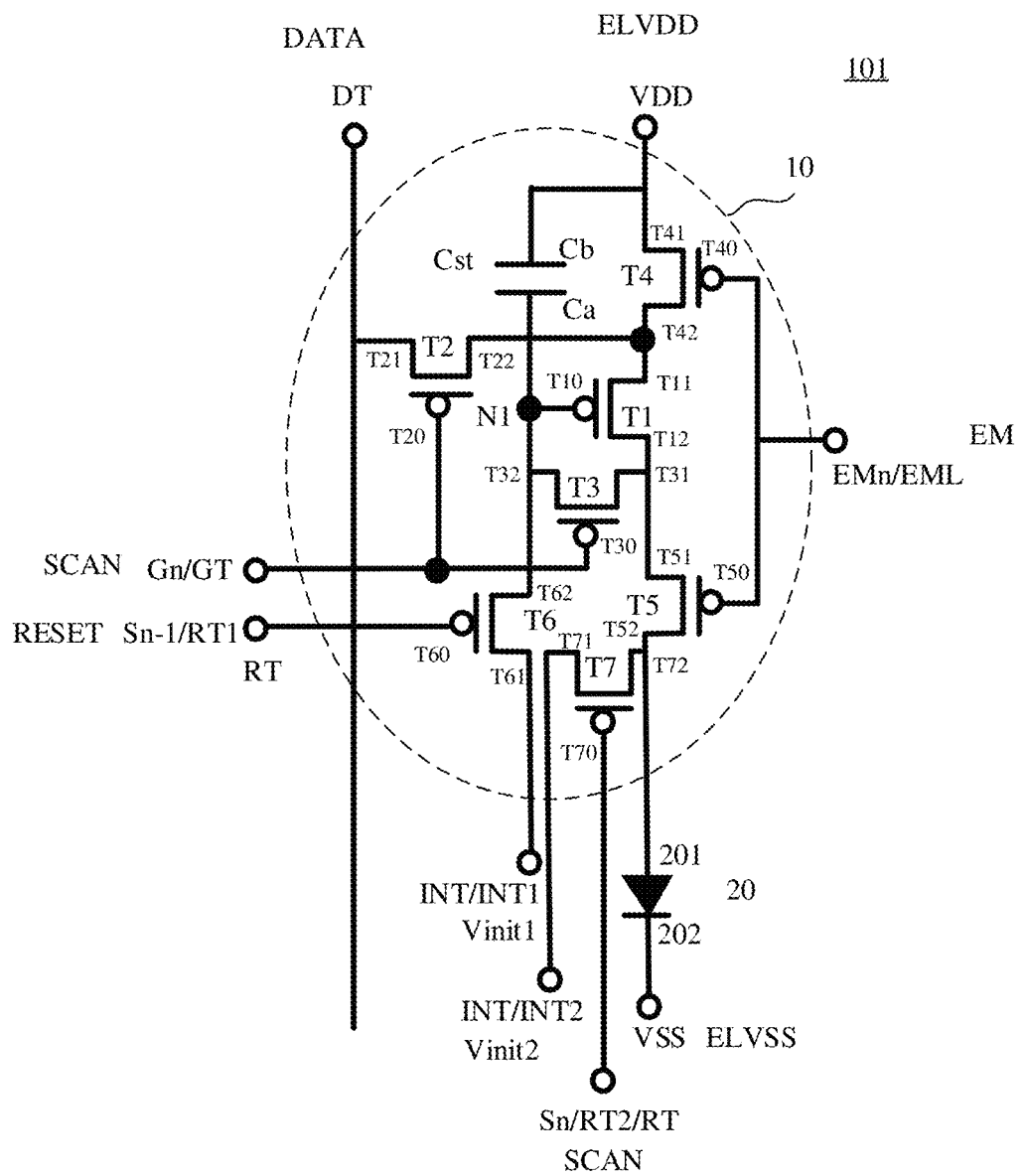
FIG. 1 is a schematic diagram of a 7T1C pixel circuit.
Figure 2:
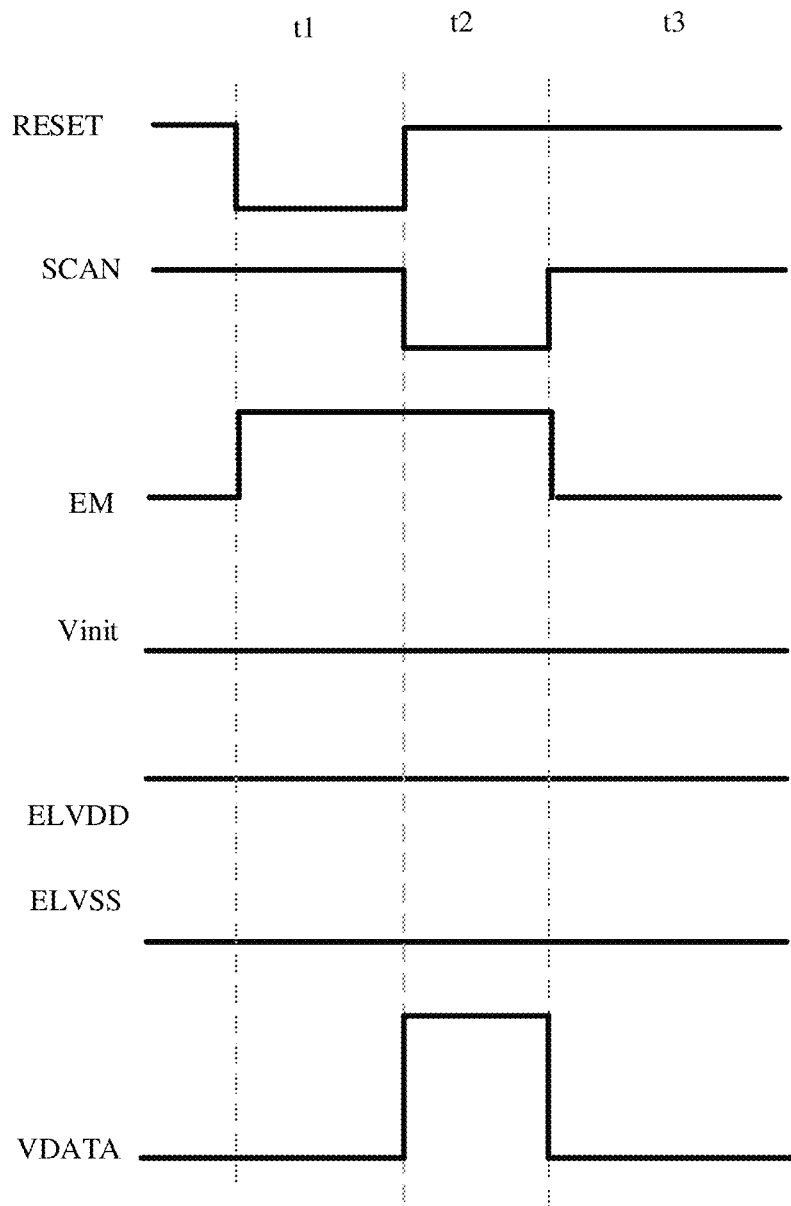
FIG. 2 is a working sequence diagram of the pixel circuit shown in FIG. 1.

FIG. 1 is a schematic diagram of a 7T1C pixel circuit. FIG. 2 is an operation sequence diagram of the pixel circuit shown in FIG. 1. The pixel circuit shown in FIG. 1 can be a pixel circuit of a low temperature poly-silicon (LTPS) AMOLED that is commonly used in related art.

FIG. 1 shows a pixel circuit of a pixel unit of a display panel. As illustrated by FIG. 1, the pixel unit 101 includes a pixel circuit 10 and a light-emitting element 20. The pixel circuit 10 includes six switching transistors (T2-T7), a driving transistor T1 and a storage capacitor Cst. The six switching transistors are a data writing transistor T2, a threshold compensation transistor T3, a first light-emitting control transistor T4, a second light-emitting control transistor T5, a first reset transistor T6, and a second reset transistor T7. The light-emitting element 20 includes a first electrode 201, a second electrode 202 and a light-emitting functional layer located between the first electrode 201 and the second electrode 202. For example, the first electrode 201 is an anode and the second electrode 202 is a cathode. Generally, the threshold compensation transistor T3 and the first reset transistor T6 adopt a double-gate thin film transistor (TFT) to reduce current leakage.

As illustrated by FIG. 1, the display panel includes a gate line GT, a data line DT, a first power supply terminal VDD, a second power supply terminal VSS, a light-emitting control signal line EML, an initialization signal line INT, a reset control signal line RT, and the like. For example, the reset control signal line RT includes a first reset control signal line RT1 and a second reset control signal line RT2. The first power supply terminal VDD is configured to provide a constant first voltage signal ELVDD to the pixel unit 101, and the second power supply terminal VSS is configured to provide a constant second voltage signal ELVSS to the pixel unit 101, and the first voltage signal ELVDD is larger than the second voltage signal ELVSS. The gate line GT is configured to provide a scanning signal SCAN to the pixel unit 101, the DATA line DT is configured to provide a data signal DATA (data voltage VDATA) to the pixel unit 101, the light-emitting control signal line EML is configured to provide a light-emitting control signal EM to the pixel unit 101, the first reset control signal line RT1 is configured to provide a reset control signal RESET to the pixel unit 101, the second reset control signal line RT2 is configured to provide a scan signal SCAN to the pixel unit 101, and the initialization signal line INT is configured to provide an initialization signal Vinit to the pixel unit 101. For example, the initialization signal Vinit is a constant voltage signal, and its magnitude can be between the first voltage signal ELVDD and the second voltage signal ELVSS, but is not limited thereto. For example, the initialization signal Vinit can be greater than or equal to the second voltage signal ELVSS. For example, the initialization signal line INT includes a first initialization signal line INT1 and a second initialization signal line INT2. For example, the first initialization signal line INT1 is configured to provide an initialization signal Vinit1 to the pixel unit 101, and the second initialization signal line INT2 is configured to provide an initialization signal Vinit2 to the pixel unit 101. For example, in some embodiments, the first initialization signal Vinit1 and the second initialization signal Vinit2 are equal to each other and both are Vinit.

As illustrated by FIG. 1, the driving transistor T1 is electrically connected with the light-emitting element 20, and outputs a driving current to drive the light-emitting element 20 to emit light under the control of a scan signal SCAN, a data signal DATA, a first voltage signal ELVDD, a second voltage signal ELVSS, and the like.

For example, the light-emitting element 20 is an organic light-emitting diode (OLED), and the light-emitting element 20 emits red light, green light, blue light, or white light driven by a corresponding pixel circuit 10 of the light-emitting element 20. For example, a pixel includes a plurality of pixel units. A pixel may include a plurality of pixel units emitting light of different colors. For example, a pixel includes a pixel unit emitting red light, a pixel unit emitting green light and a pixel unit emitting blue light, but the present disclosure is not limited thereto. The number of pixel units included in a pixel and the light-emitting condition of each pixel unit can be determined as required.

For example, as illustrated by FIG. 1, a gate electrode T20 of the data writing transistor T2 is connected with the gate line GT, a first electrode T21 of the data writing transistor T2 is connected with the data line DT, and a second electrode T22 of the data writing transistor T2 is connected with a first electrode T11 of the driving transistor T1.

For example, as illustrated by FIG. 1, the pixel circuit 10 further includes a threshold compensation transistor T3, a gate electrode T30 of the threshold compensation transistor T3 is connected with the gate line GT, a first electrode T31 of the threshold compensation transistor T3 is connected with the second electrode T12 of the driving transistor T1, and a second electrode T32 of the threshold compensation transistor T3 is connected with a gate electrode T10 of the driving transistor T1.

For example, as illustrated by FIG. 1, the display panel further includes a light-emitting control signal line EML, and the pixel circuit 10 further includes a first light-emitting control transistor T4 and a second light-emitting control transistor T5. A gate electrode T40 of the first light-emitting control transistor T4 is connected with the light-emitting control signal line EML, a first electrode T41 of the first light-emitting control transistor T4 is connected with the first power supply terminal VDD, and a second electrode T42 of the first light-emitting control transistor T4 is connected with the first electrode T11 of the driving transistor T1. A gate electrode T50 of the second light-emitting control transistor T5 is connected with the light-emitting control signal line EML, a first electrode T51 of the second light-emitting control transistor T5 is connected with the second electrode T12 of the driving transistor T1, and a second electrode T52 of the second light-emitting control transistor T5 is connected with the first electrode 201 of the light-emitting element 20.

As illustrated by FIG. 1, the first reset transistor T6 is connected with the gate electrode T10 of the driving transistor T1 and configured to reset the gate electrode of the driving transistor T1, and the second reset transistor T7 is connected with the first electrode 201 of the light-emitting element 20 and configured to reset the first electrode 201 of the light-emitting element 20. The first initialization signal line INT1 is connected with the gate electrode of the driving transistor T1 through the first reset transistor T6. The second initialization signal line INT2 is connected with the first electrode 201 of the light-emitting element 20 through the second reset transistor T7. For example, the first initialization signal line INT1 and the second initialization signal line INT2 are connected, and input with the same initialization signal, but the embodiments of the present disclosure are not limited thereto. In some embodiments, the first initialization signal line INT1 and the second initialization signal line INT2 may also be insulated from each other and configured to be input with signals separately.

For example, as illustrated by FIG. 1, the first electrode T61 of the first reset transistor T6 is connected with the first initialization signal line INT1, the second electrode T62 of the first reset transistor T6 is connected with the gate electrode T10 of the driving transistor T1, the first electrode T71 of the second reset transistor T7 is connected with the second initialization signal line INT2, and the second electrode T72 of the second reset transistor T7 is connected with the first electrode 201 of the light-emitting element 20. For example, as illustrated by FIG. 1, the gate electrode T60 of the first reset transistor T6 is connected with the first reset control signal line RT1, and the gate electrode T70 of the second reset transistor T7 is connected with the second reset control signal line RT2.

As illustrated by FIG. 1, the first power supply terminal VDD is configured to provide a first voltage signal ELVDD to the pixel circuit 10; the pixel circuit also includes a storage capacitor Cst, a first electrode Ca of the storage capacitor Cst is connected with the gate electrode T10 of the driving transistor T1, and the second electrode Cb of the storage capacitor Cst is connected with the first power supply terminal VDD.

For example, as illustrated by FIG. 1, the display panel further includes a second power supply terminal VSS, which is connected with the second electrode 201 of the light-emitting element 20.

As illustrated by FIG. 2, in a frame display period, the driving method of the pixel unit includes a first reset phase t1, a data writing, threshold compensation and second reset phase t2, and a light-emitting phase t3. Upon the reset control signal RESET being at a low level, the gate electrode of the driving transistor T1 is reset, and upon the scan signal SCAN being at a low level, the first electrode 201 (for example, an anode) of the light-emitting element 20 is reset. For example, as illustrated by FIG. 1, in the case where the scan signal SCAN is at a low level, the data voltage VDATA is written, and the threshold voltage Vth of the driving transistor T1 is acquired at the same time, and the data voltage VDADA containing the data information on the data line is stored in the capacitor Cst; in the case where the light-emitting control signal line EML is at a low level, the light-emitting element 20 emits light, and the voltage of the first node N1 (a gate electrode point) is maintained (the light emission stability of the light-emitting element 20) by the storage capacitor Cst. In the driving process of the pixel circuit 10, in the light-emitting phase, the storage capacitor is used to maintain the voltage signal, so that the potential of its signal holding terminal is kept constant, and a voltage difference is formed between the gate electrode and the source electrode of the driving transistor, thereby controlling the driving transistor to form a driving current, thereby driving the light-emitting element 20 to emit light.

As illustrated by FIG. 2, in the reset phase t1, the light-emitting control signal EM is set to the turn-off voltage, the reset control signal RESET is set to the turn-on voltage, and the scan signal SCAN is set to the turn-off voltage.

As illustrated by FIG. 2, in the data writing and threshold compensation phase and the second reset phase t2, the light-emitting control signal EM is set to the turn-off voltage, the reset control signal RESET is set to the turn-off voltage, and the scan signal SCAN is set to the turn-on voltage.

As illustrated by FIG. 2, in the light-emitting phase t3, the light-emitting control signal EM is set as the turn-on voltage, the reset control signal RESET is set as the turn-off voltage, and the scan signal SCAN is set as the turn-off voltage.

As illustrated by FIG. 2, both the first voltage signal ELVDD and the second voltage signal ELVSS are constant voltage signals. For example, the initialization signal Vinit is between the first voltage signal ELVDD and the second voltage signal ELVSS.

For example, the turn-on voltage in the embodiment of the present disclosure refers to a voltage that can conduct the first electrode and the second electrode of the corresponding transistors, and the turn-off voltage refers to a voltage that can disconnect the conducting path between the first electrode and the second electrode of the corresponding transistors. In the case where the transistor is a P-type transistor, the turn-on voltage is a low voltage (for example, 0V) and the turn-off voltage is a high voltage (for example, 5V). In the case where the transistor is an N-type transistor, the turn-on voltage is a high voltage (for example, 5V) and the turn-off voltage is a low voltage (for example, 0V). The driving waveforms shown in FIG. 2 are all explained by taking P-type transistors as an example. For example, the turn-on voltage is a low voltage (e.g., 0V) and the turn-off voltage is a high voltage (e.g., 5V), but the embodiments of the present disclosure are not limited thereto.

Referring to FIG. 1 and FIG. 2 together, in the first reset phase t1, the light-emitting control signal EM is the turn-off voltage, the reset control signal RESET is the turn-on voltage, and the scan signal SCAN is the turn-off voltage. In this case, the first reset transistor T6 is in an ON state, while the second reset transistor T7, the data writing transistor T2, the threshold compensation transistor T3, the first light-emitting control transistor T4 and the second light-emitting control transistor T5 are in an OFF state. The first reset transistor T6 transmits the first initialization signal (initialization voltage Vinit) ViniT1 to the gate electrode of the driving transistor T1 and is stored in the storage capacitor Cst, thereby resetting the driving transistor T1 and erasing the data stored in the last light emission (previous frame).

In the data writing, threshold compensation and second reset phase t2, the light-emitting control signal EM is the turn-off voltage, the reset control signal Reset is the turn-off voltage, and the scan signal SCAN is the turn-on voltage. In this case, the data writing transistor T2 and the threshold compensation transistor T3 are in an ON state, and the second reset transistor T7 is in an ON state, and the second reset transistor T7 transmits a second initialization signal (initialization voltage Vinit) Vinit2 to the first electrode 201 of the light-emitting element 20 to reset the light-emitting element 20. While the first light-emitting control transistor T4, the second light-emitting control transistor T5 and the first reset transistor T6 are in the OFF state. In this case, the data writing transistor T2 transmits the data voltage VDATA to the first electrode of the driving transistor T1, that is, the data writing transistor T2 receives the scan signal SCAN and the data voltage VDATA and writes the data voltage VDATA to the first electrode of the driving transistor T1 according to the scan signal SCAN. The threshold compensation transistor T3 is turned on to connect the driving transistor T1 into a diode structure, whereby the gate electrode of the driving transistor T1 can be charged. After the charging is completed, the gate voltage of the driving transistor T1 is VDATA+Vth, where VDATA is the data voltage and Vth is the threshold voltage of the driving transistor T1, that is, the threshold compensation transistor T3 receives the scan signal SCAN and performs threshold voltage compensation on the gate voltage of the driving transistor T1 according to the scan signal SCAN. At this phase, the voltage difference across the storage capacitor Cst is ELVDD−VDATA−Vth.

In the light-emitting phase t3, the light-emitting control signal EM is a turn-on voltage, the reset control signal RESET is a turn-off voltage, and the scan signal SCAN is a turn-off voltage. The first light-emitting control transistor T4 and the second light-emitting control transistor T5 are in an ON state, while the data writing transistor T2, the threshold compensation transistor T3, the first reset transistor T6 and the second reset transistor T7 are in an OFF state. The first voltage signal ELVDD is transmitted to the first electrode of the driving transistor T1 through the first light-emitting control transistor T4, the gate voltage of the driving transistor T1 is kept at VDATA+Vth, and the light-emitting current I flows into the light-emitting element 20 through the first light-emitting control transistor T4, the driving transistor T1 and the second light-emitting control transistor T5, and the light-emitting element 20 emits light. That is, the first light-emitting control transistor T4 and the second light-emitting control transistor T5 receive the light-emitting control signal EM and control the light-emitting element 20 to emit light according to the light-emitting control signal EM. The light-emitting current I satisfies the following saturation current formula:

$$K(Vgs-Vth)^2=K(VDATA+Vth-ELVDD-Vth)^2=K(VDATA-ELVDD)^2$$

where, $$K = 0.5\mu_n Cox\frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and source electrode of the driving transistor T1 (that is, the first electrode of the driving transistor T1 in this embodiment).

It can be seen from the above formula that the current flowing through the light-emitting element 20 has nothing to do with the threshold voltage of the driving transistor T1. Therefore, the pixel circuit perfectly compensates the threshold voltage of the driving transistor T1.

For example, a ratio of the duration of the light-emitting phase t3 to the display period of one frame can be adjusted.

In this way, the light-emitting brightness can be controlled by adjusting the ratio of the duration of the light-emitting phase t3 to the display period of one frame. For example, the ratio of the duration of the light-emitting phase t3 to one frame of display time can be adjusted by controlling the scanning driving circuit in the display panel or an additionally provided driving circuit.

For example, the embodiments of the present disclosure are not limited to the specific pixel circuit shown in FIG. 1, and other pixel circuits that can realize compensation on the driving transistor can be adopted. Based on the description and teaching of this implementation in the present disclosure, other settings that can be easily thought of by ordinary skilled in this field without making creative work belong to the protection scope of the present disclosure.

Figure 3:
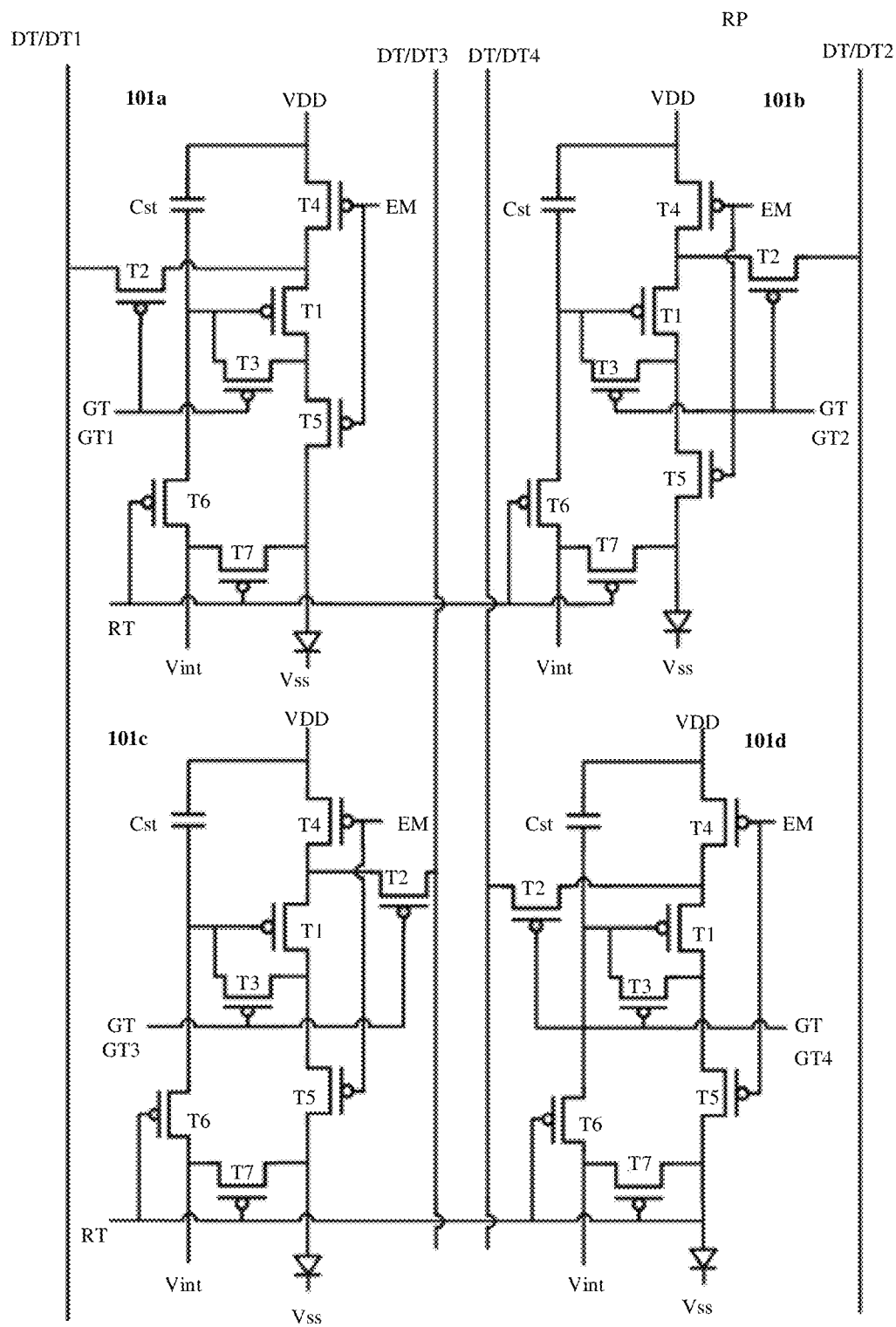
FIG. 3 is a diagram of a pixel circuit of a repeating unit in a display panel provided by an embodiment of the present disclosure.

FIG. 3 is a diagram of a pixel circuit of a repeating unit in a display panel provided by an embodiment of the present disclosure. As illustrated by FIG. 3, the display panel includes a first pixel unit 101a, a second pixel unit 101b, a third pixel unit 101c, and a fourth pixel unit 101d, and the first pixel unit 101a, the second pixel unit 101b, and the third pixel unit 101c and the fourth pixel unit 101d constitute a repeating unit RP. Multiple repeating units RP can form an array. The repeating unit RP is the smallest repeating unit of the display array.

For example, the display panel adopts a double gate and double data line driving mode, which can achieve the independent control of the first pixel unit 101a, the second pixel unit 101b, the third pixel unit 101c, and the fourth pixel unit 101d. During the driving process of the display panel, the first pixel unit 101a, the second pixel unit 101b, the third pixel unit 101c, and the fourth pixel unit 101d are respectively lit in sequence. Because of the dual gate and dual data line control, the gate line of the first pixel unit 101a can be in a continuous turn-on state until the writing of the data signal to the fourth pixel unit 101d is completed, and the other pixel units are the same, so that each pixel unit can have sufficient compensation time.

As illustrated by FIG. 3, the first pixel unit 101a and the second pixel unit 101b are located in the same row and are located in adjacent columns, and the third pixel unit 101c and the fourth pixel unit 101d are located in the same row and are located in adjacent columns. The first pixel unit 101a and the third pixel unit 101c are located in the same column and are located in adjacent rows, and the second pixel unit 101b and the fourth pixel unit 101d are located in the same column and are located in adjacent rows.

FIG. 3 shows a first data line DT1, a second data line DT2, a third data line DT3, and a fourth data line DT4. 3. As shown in FIG. 3, the first data line DT1 is connected to the first pixel unit 101a, the second data line DT2 is connected to the second pixel unit 101b, the third data line DT3 is connected to the third pixel unit 101c, and the fourth data line DT4 is connected to the four pixel units 101d.

In FIG. 3, in the same pixel unit, the first reset transistor T6 and the second reset transistor T7 are connected to the same reset control signal line RT to be inputted with the same reset control signal at the same time, but the embodiments of the present disclosure are not limited thereto.

In other embodiments, in the same pixel unit, the first reset transistor T6 and the second reset transistor T7 may be connected to the first reset control signal line and the second reset control signal line, respectively, and the first reset control signal line and the second reset control signal lines are insulated from each other to be inputted with signals respectively. In this case, the first reset transistor T6 and the second reset transistor T7 are inputted with signals at different times. As mentioned above, the first reset transistor T6 is inputted with the reset control signal RESET during the first reset stage t1, and the second reset transistor T7 is inputted with the scan signal SCAN during the data writing, threshold compensation and the second reset stage t2. For example, the gate line GT of this stage is connected to the reset control signal line of the next stage. For example, the gate line GT and the second reset control signal line RT2 may be electrically connected to input the same signal at the same time.

Figure 4:
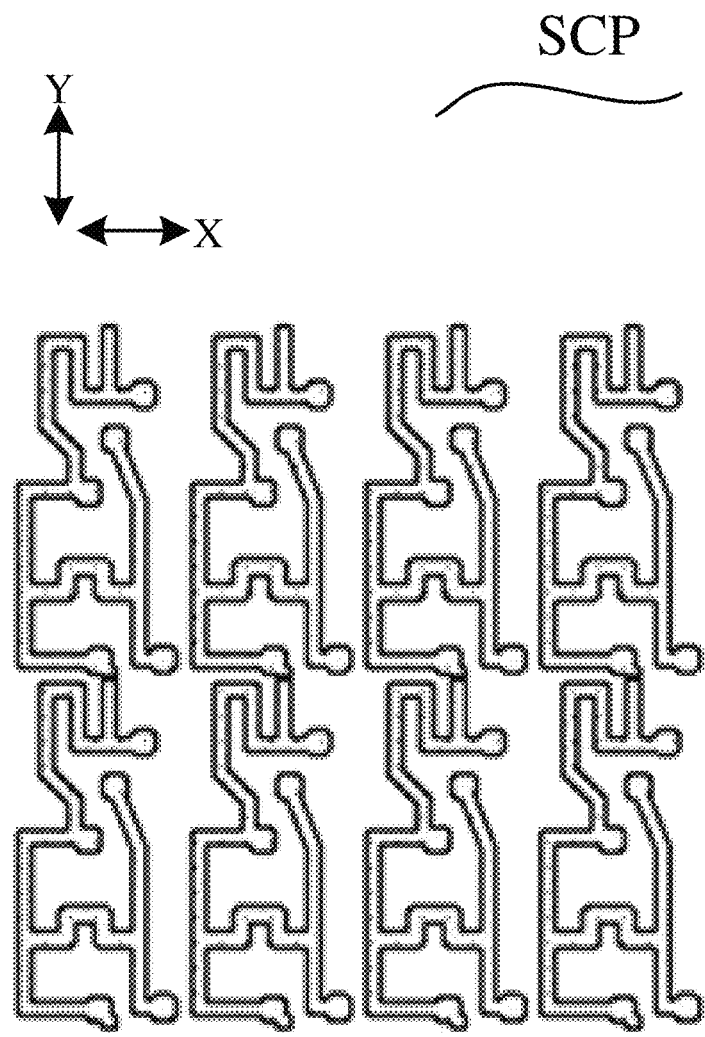
FIG. 4 is a plan view of a semiconductor pattern in a display panel provided by an embodiment of the present disclosure.
Figure 5:
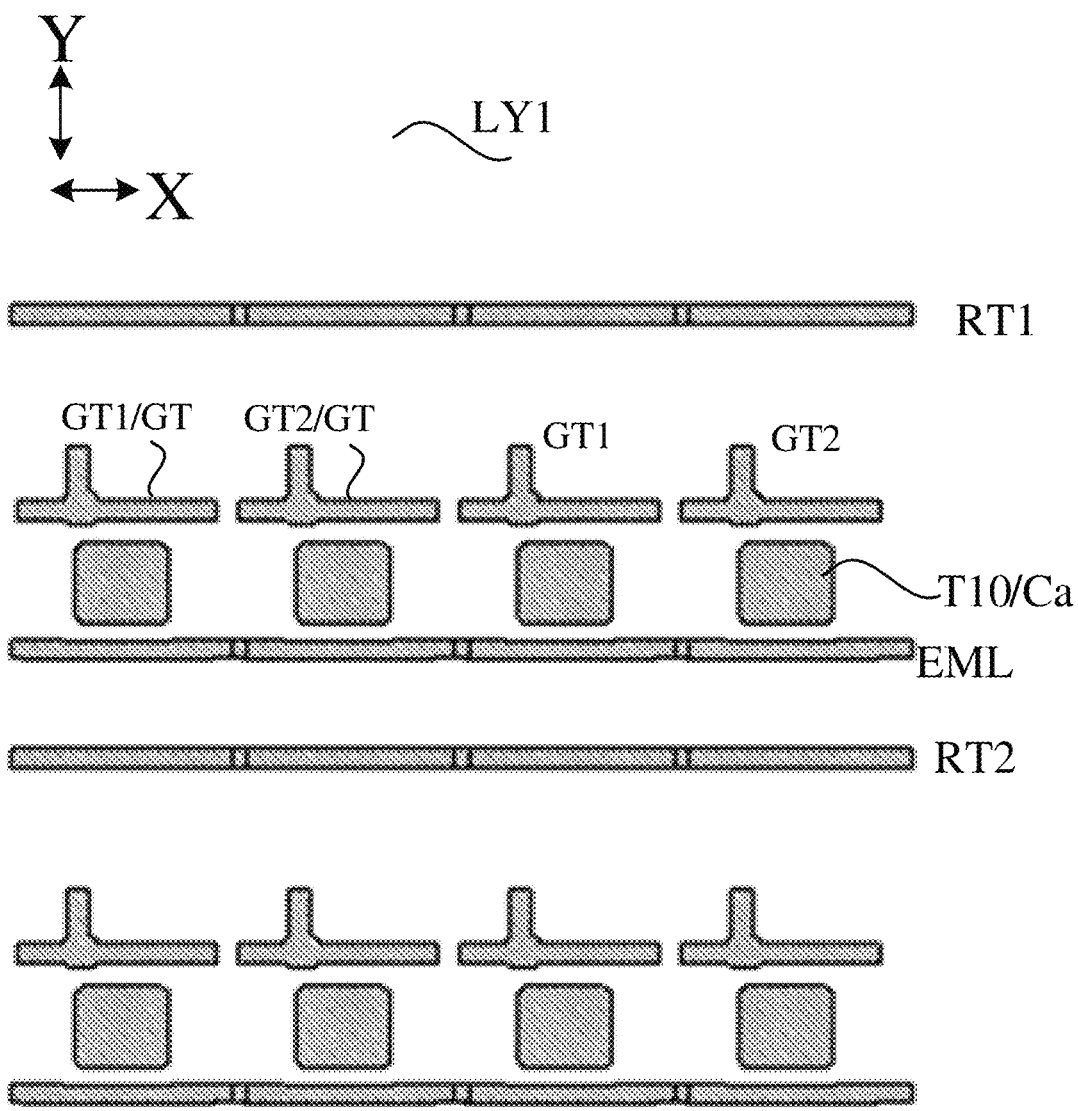
FIG. 5 is a plan view of a first conductive pattern layer in a display panel provided by an embodiment of the present disclosure.
Figure 6:
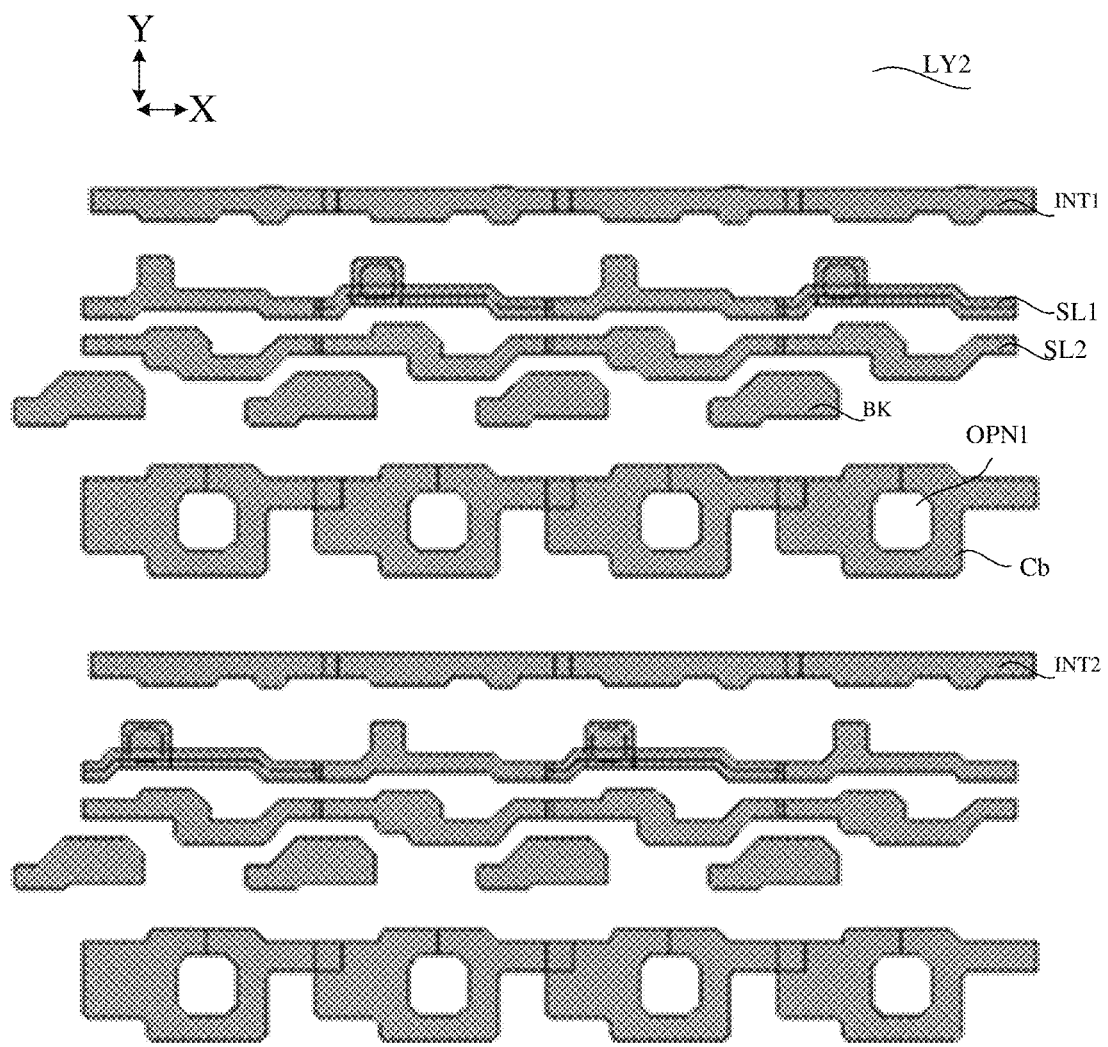
FIG. 6 is a plan view of a second conductive pattern layer in a display panel provided by an embodiment of the present disclosure.
Figure 7:
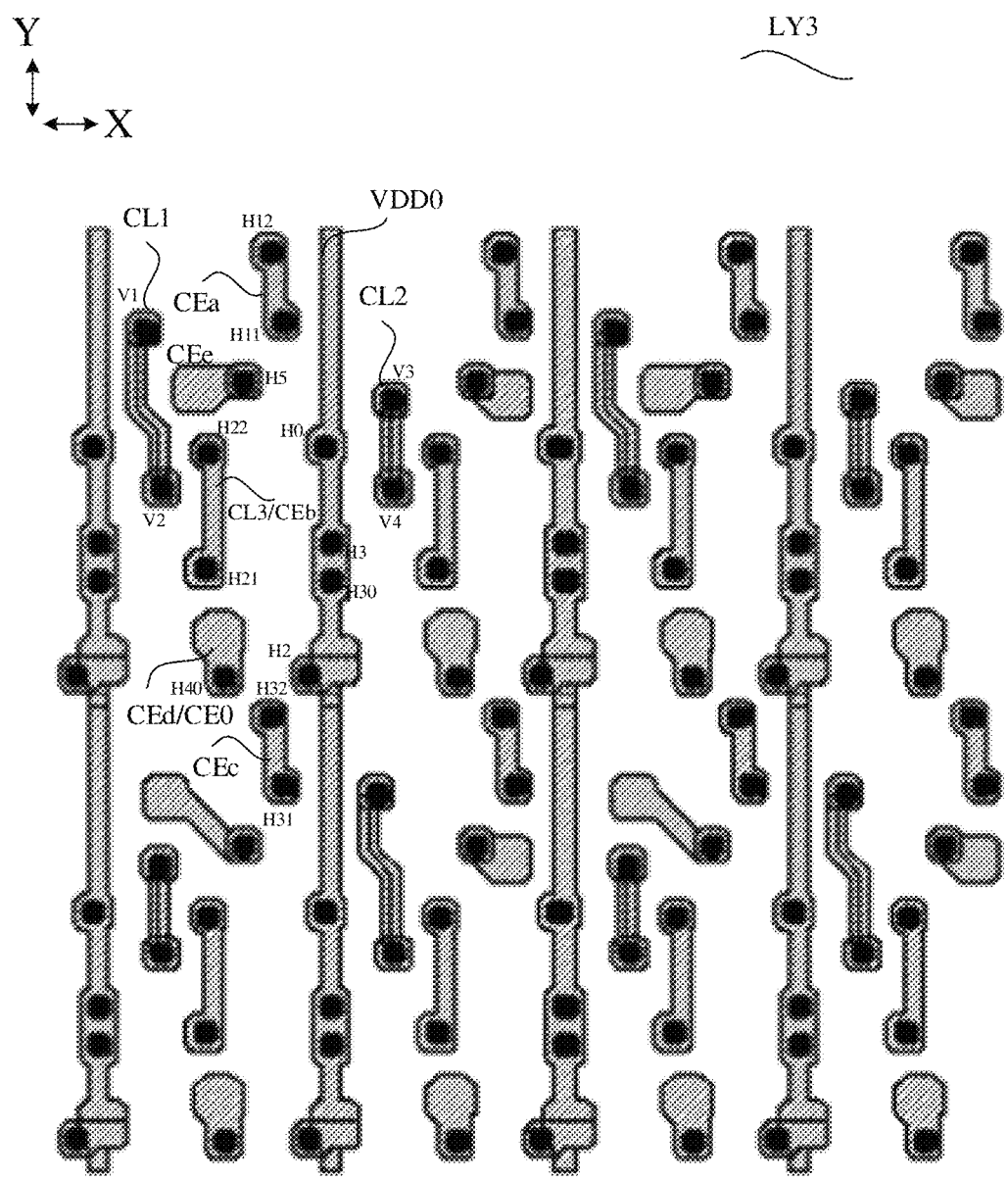
FIG. 7 is a plan view of a third conductive pattern layer in a display panel provided by an embodiment of the present disclosure.
Figure 8:
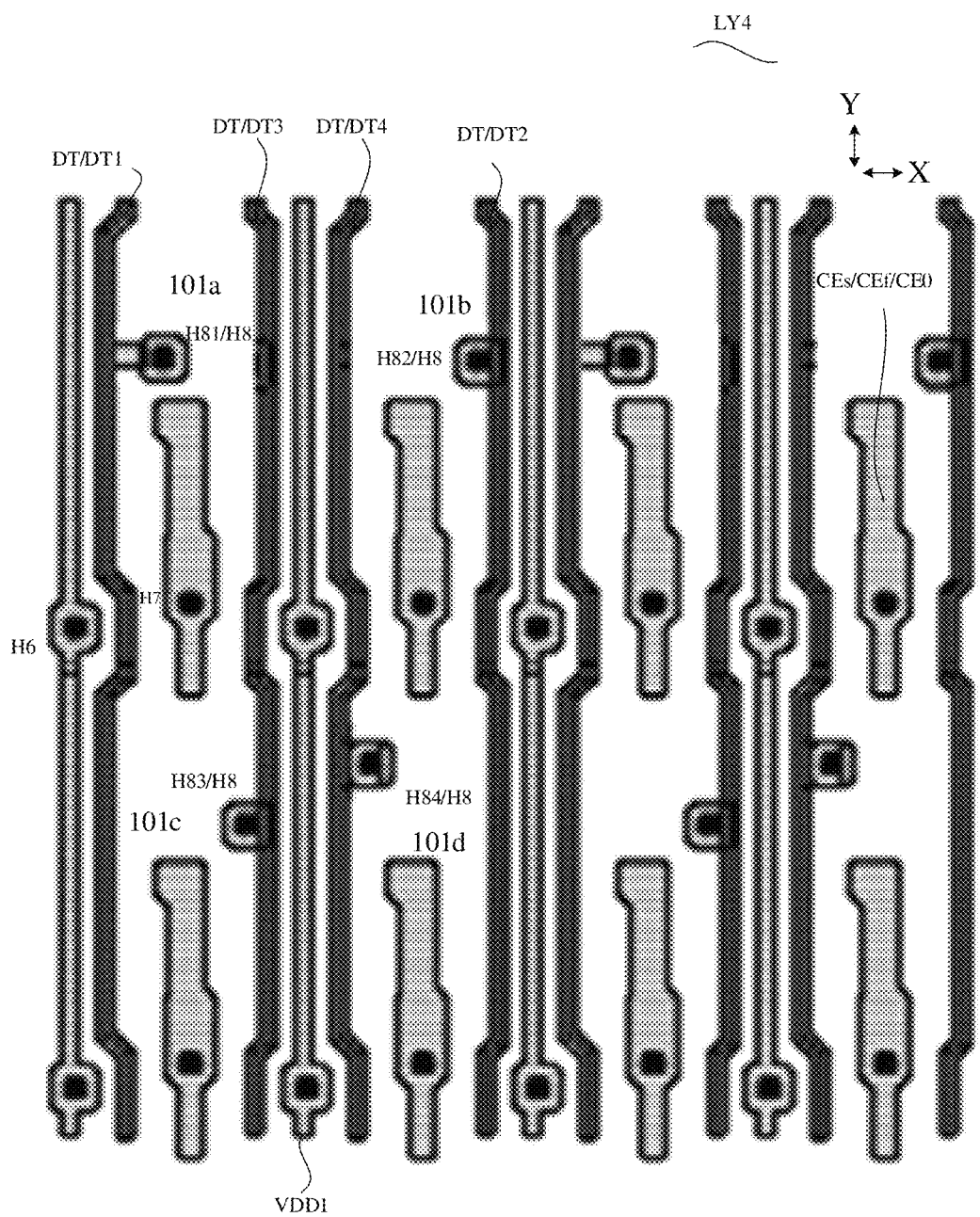
FIG. 8 is a plan view of a fourth conductive pattern layer in a display panel provided by an embodiment of the present disclosure.
Figure 9:
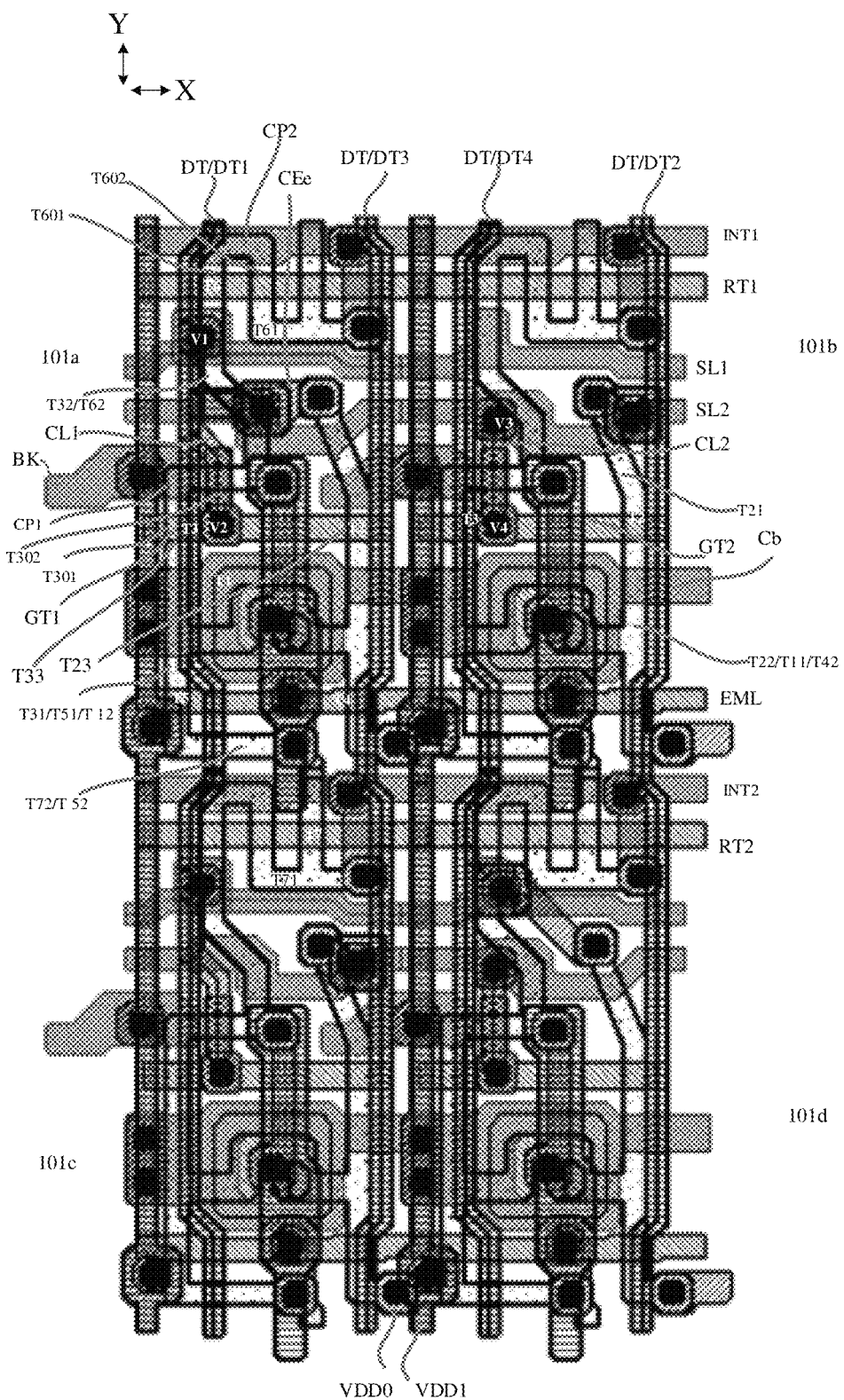
FIG. 9 is a plan view of a structure of a repeating unit after forming a fourth conductive pattern layer in a display panel provided by an embodiment of the present disclosure.
Figure 10:
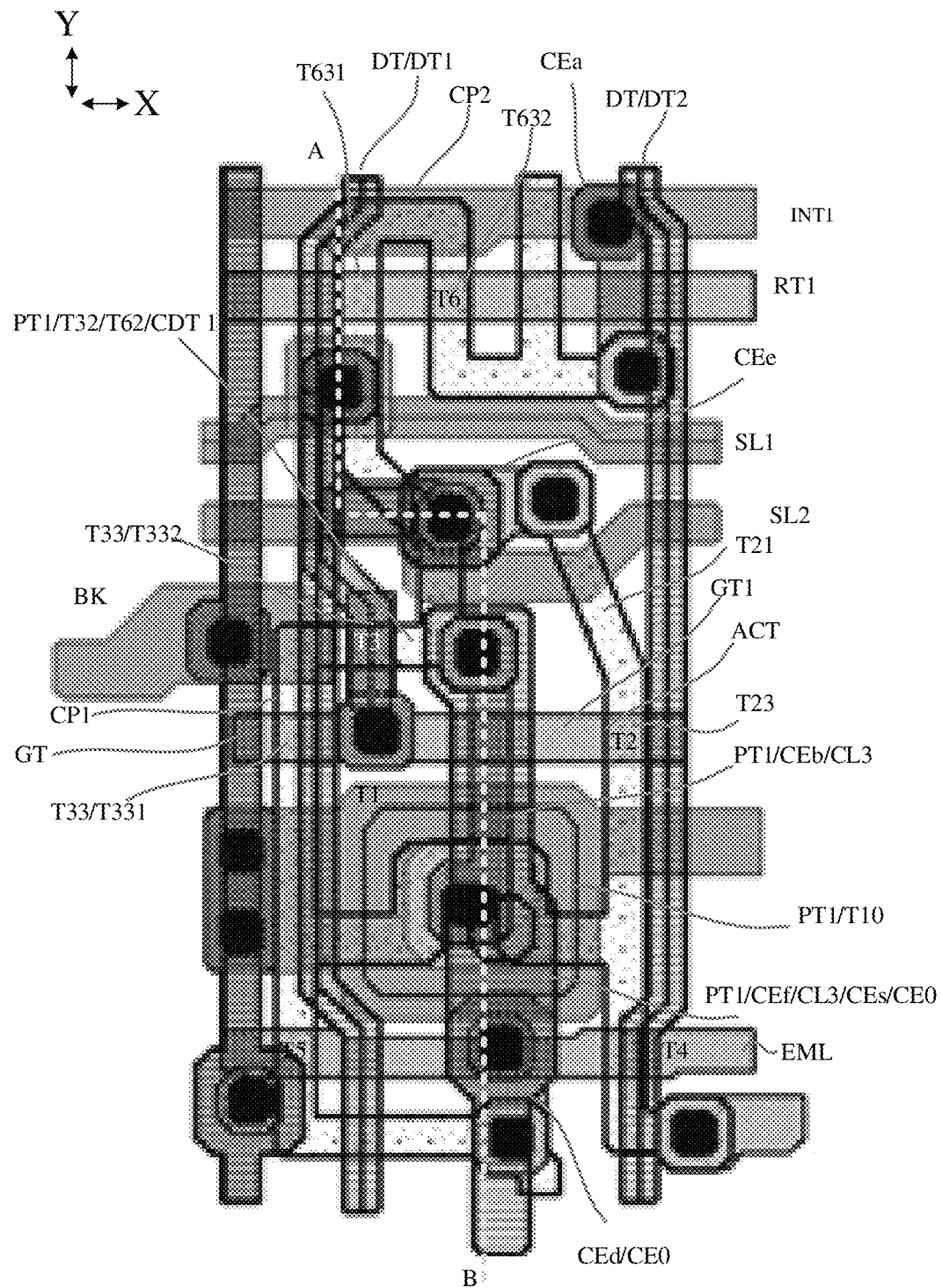
FIG. 10 is a plan view of a structure of a pixel unit after forming a fourth conductive pattern layer in a display panel provided by an embodiment of the present disclosure.
Figure 11:
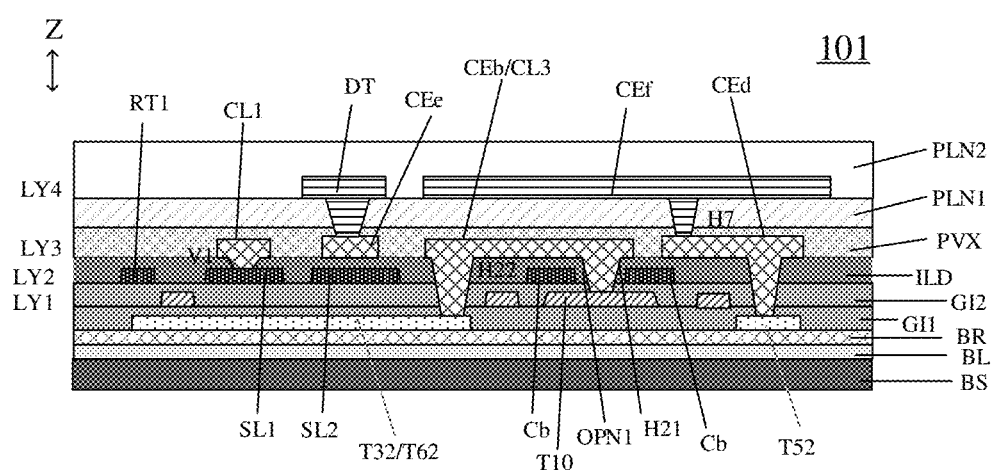
FIG. 11 is a cross-sectional view along line AB of FIG. 10.
Figure 12:
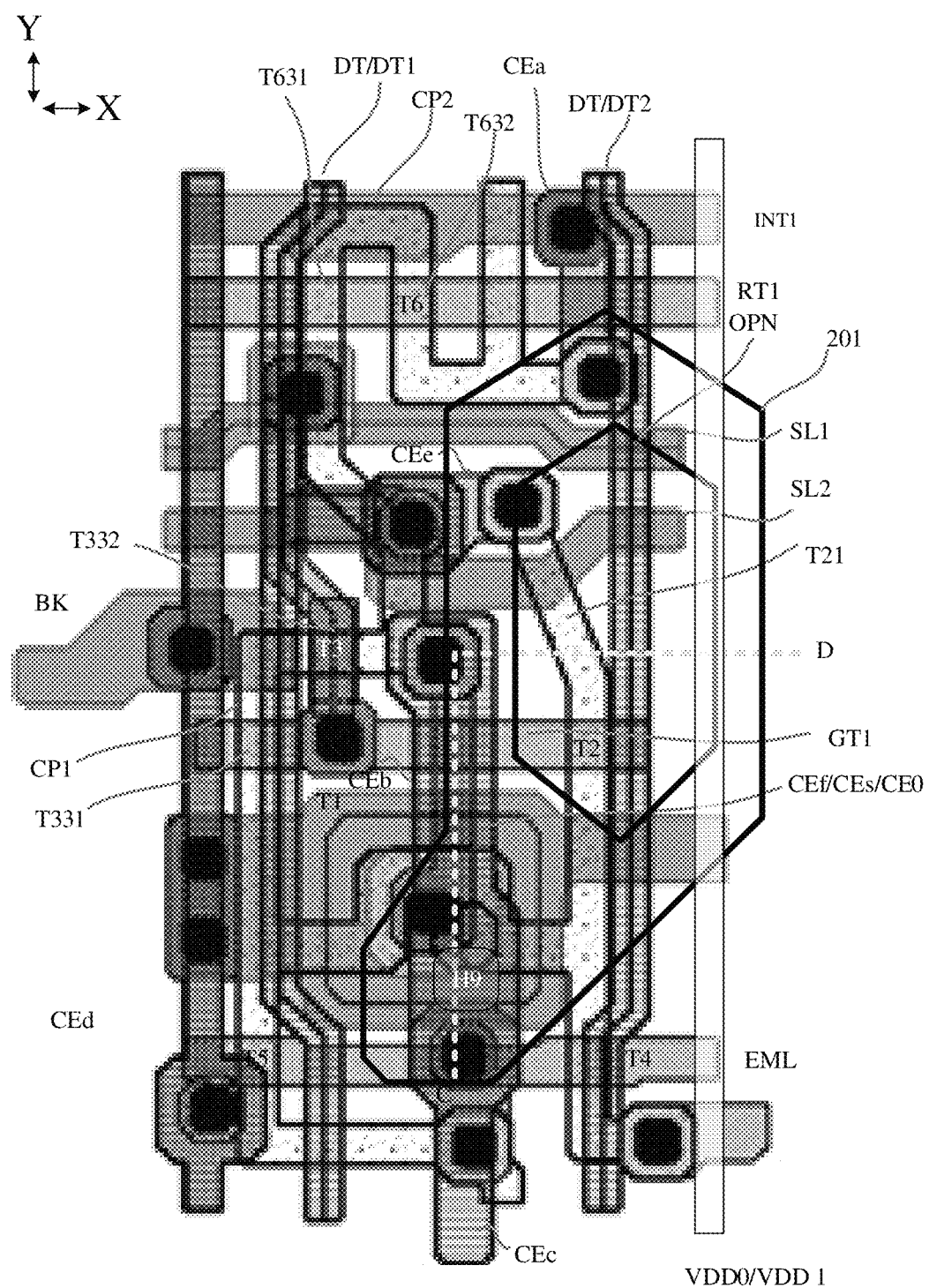
FIG. 12 is a plan view of a structure of a pixel unit after forming a light-emitting element in a display panel provided by an embodiment of the present disclosure.
Figure 13:
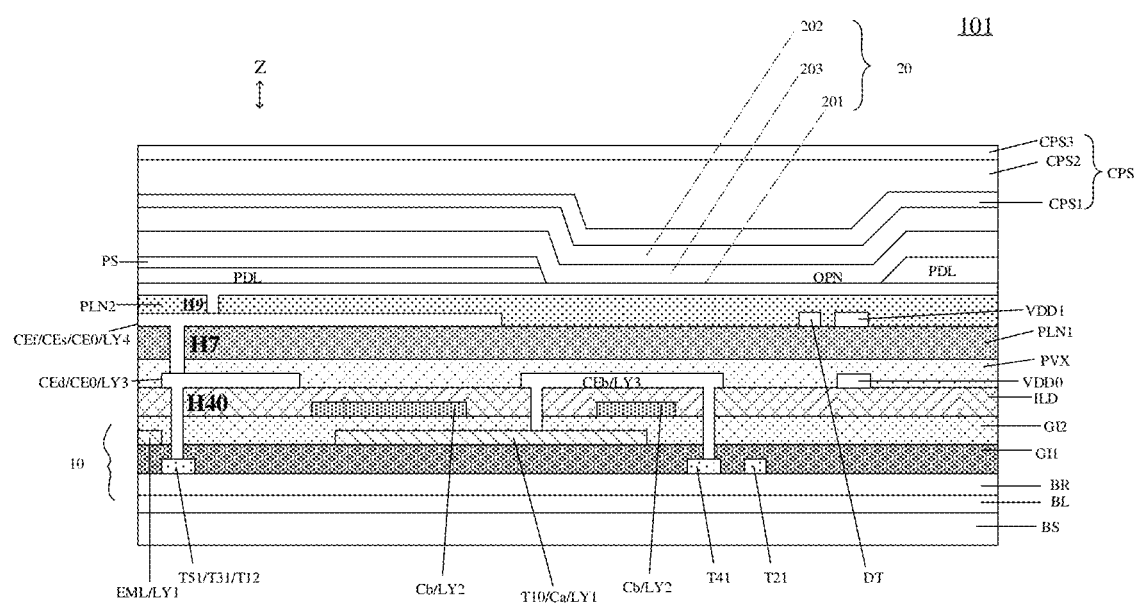
FIG. 13 is a cross-sectional view along line CD of FIG. 12.

A display panel provided by an embodiment of the present disclosure will be described below with reference to FIGS. 4 to 11. FIG. 4 is a plan view of a semiconductor pattern in a display panel provided by an embodiment of the present disclosure; FIG. 5 is a plan view of a first conductive pattern layer in a display panel provided by an embodiment of the present disclosure; FIG. 6 is a plan view of a second conductive pattern layer in a display panel provided by an embodiment of the present disclosure; FIG. 7 is a plan view of a third conductive pattern layer in a display panel provided by an embodiment of the present disclosure; FIG. 8 is a plan view of a fourth conductive pattern layer in a display panel provided by an embodiment of the present disclosure; FIG. 9 is a plan view of a structure of a repeating unit after forming a fourth conductive pattern layer in a display panel provided by an embodiment of the present disclosure; FIG. 10 is a plan view of a structure of a pixel unit after forming a fourth conductive pattern layer in a display panel provided by an embodiment of the present disclosure; FIG. 11 is a cross-sectional view along line AB of FIG. 10; FIG. 12 is a plan view of a structure of a pixel unit after forming a light-emitting element in a display panel provided by an embodiment of the present disclosure; and FIG. 13 is a cross-sectional view along line CD of FIG. 12.

FIGS. 4-10 show a first direction X and a second direction Y, and the second direction Y intersects with the first direction X. For example, the embodiment of the present disclosure takes the case where first direction X and the second direction Y are perpendicular as an example. For example, the first direction X is a row direction of pixel units, and the second direction Y is a column direction of pixel units. The first direction X and the second direction Y are both directions parallel to the base substrate BS. FIGS. 11 and 13 show a third direction Z, which is a direction perpendicular to the base substrate BS. A third direction Z is perpendicular to the first direction X and perpendicular to the second direction Y.

In the embodiment of the present disclosure, for the sake of clarity of illustration, the insulating layer is shown in the form of a via hole in a plan view, and the insulating layer itself is treated as being transparent, and the first conductive pattern layer, the second conductive pattern layer, the third conductive pattern layer and the fourth conductive pattern layer are treated as being semi-transparent.

FIG. 4 shows a semiconductor pattern SCP, and FIG. 5 shows a first conductive pattern layer LY1. For example, a first gate insulating layer (a first gate insulating layer GI1, refer to FIG. 11) is arranged between the first conductive pattern layer LY1 and the semiconductor pattern SCP. For example, a semiconductor pattern SCP and subsequent various components are formed on the base substrate. As illustrated by FIG. 5, the first conductive pattern layer LY1 includes a first reset control signal line RT1, a first gate line GT1, a second gate line GT2, a first electrode Ca of the storage capacitor Cst (a gate electrode T10 of the driving transistor T1), a light-emitting control signal line EML, and a second reset control signal line RT2.

The first conductive pattern layer LY1 is used as a mask to dope the semiconductor pattern SCP, so that the area covered by the first conductive pattern layer LY1 retains semiconductor characteristics and forms an active layer ACT (referring to FIG. 10), while the area not covered by the first conductive pattern layer LY1 of the semiconductor pattern SCP is conductive to form the source electrode and drain electrode of the thin film transistor. The active layer ACT formed after a part of the semiconductor pattern SCP has been made into being conductive is shown in FIG. 10.

For example, in the manufacturing process of the display panel, the semiconductor pattern layer SCP is subjected to conductive treatment by using the first conductive pattern layer LY1 as a mask, for example, the semiconductor pattern layer SCP is heavily doped by ion implantation process, so that the part of the semiconductor pattern layer SCP not covered by the first conductive pattern layer LY1 is conductive, and a source region (first electrode T11) and a drain region (second electrode T12) of a driving transistor T1, a source region (first electrode T21) and a drain region (second electrode T22) of a data writing transistor T2, a source region (first electrode T31) and a drain region (second electrode T32) of a threshold compensation transistor T3, a source region (first electrode T41) and a source region (second electrode T42) of a first light-emitting control transistor T4, a source region (first electrode T51) and a drain region (second electrode T52) of a second light-emitting control transistor T5, a source region (first electrode T61) and a drain region (second electrode T62) of a first reset transistor T6, and a source region (first electrode T71) and a drain region (second electrode T72) of a second reset transistor T7 are formed. A part of the semiconductor pattern layer SCP covered by the first conductive pattern layer L1 retains semiconductor characteristics, so as to form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. A channel region of each transistor constitutes an active layer ACT (refer to FIG. 10).

For example, with reference to FIG. 1, FIG. 4, FIG. 9 and FIG. 10, the second electrode T72 of the second reset transistor T7 and the second electrode T52 of the second light-emitting control transistor T5 are integrally formed; the first electrode T51 of the second light-emitting control transistor T5, the second electrode T12 of the driving transistor T1 and the first electrode T31 of the threshold compensation transistor T3 are integrally formed; the first electrode T11 of the driving transistor T1, the second electrode T22 of the data writing transistor T2 and the second electrode T42 of the first light-emitting control transistor T4 are integrally formed. The second electrode T32 of the threshold compensation transistor T3 and the second electrode T62 of the first reset transistor T6 are integrally formed.

For example, the channel region (active layer) of the transistor adopted in the embodiments of the present disclosure can be monocrystalline silicon, polycrystalline silicon (such as low-temperature polycrystalline silicon) or metal oxide semiconductor materials (such as IGZO, AZO, etc.). In an embodiment, the transistors are all P-type low temperature polysilicon (LTPS) thin film transistors. In another embodiment, the threshold compensation transistor T3 and the first reset transistor T6 directly connected with the gate electrode of the driving transistor T1 are metal oxide semiconductor thin film transistors, that is, the channel materials of the transistors are metal oxide semiconductor materials (such as IGZO, AZO, etc.), and the metal oxide semiconductor thin film transistors have lower leakage current, which can help to reduce the gate leakage current of the driving transistor T1. For example, in this case, a Low Temperature Polycrystalline Oxide (LTPO) technology can be adopted to manufacture the display panel. The LTPO technology combines the advantages of LTPS (Low Temperature Poly-Silicon) thin film transistor and oxide thin film transistor. That is, two kinds of TFTs including a LTPS TFT and an oxide TFT are integrated in the same one pixel unit.

For example, the transistors adopted in the embodiments of the present disclosure may include various structures, such as top gate type, bottom gate type or double gate structure. In some embodiments, the threshold compensation transistor T3 and the first reset transistor T6, which are directly connected with the gate electrode of the driving transistor T1, are dual-gate thin film transistors, which can help to reduce the gate leakage current of the driving transistor T1.

For example, as illustrated by FIG. 5, FIG. 9, and FIG. 10, a part of the light-emitting control signal line EML serves as the gate electrode T40 of the first light-emitting control transistor T4, a part of the light-emitting control signal line EML serves as the gate electrode T50 of the second light-emitting control transistor T5, the gate electrode T60 of the first reset transistor T6 is a part of the first reset control signal line RT1, the gate electrode T70 of the second reset transistor T7 is a part of the second reset control signal line RT2, the gate electrode T20 of the data writing transistor T2 is a part of the gate line GT, and the gate electrode T30 of the threshold compensation transistor T3 is a part of the gate line GT. The Gate line GT is the first gate line GT1 and the second gate line GT2.

As illustrated by FIG. 5, the first reset control signal line RT1, the first gate line GT1, the second gate line GT2, the light-emitting control signal line EML, and the second reset control signal line RT2 all extend along the first direction X.

As illustrated by FIG. 8, FIG. 9 and FIG. 10, the data line DT extends along the second direction Y, the first data line DT1, the third data line DT3, the fourth data line DT4 and the second data line DT2 are arranged along the first direction X.

FIG. 6 shows the second conductive pattern layer LY2. For example, a second gate insulating layer (a second gate insulating layer GI2, refer to FIG. 11) is provided between the second conductive pattern layer LY2 and the first conductive pattern layer LY1. The second conductive pattern layer LY2 includes a blocker BK, a first initialization signal line INT1, a second initialization signal line INT2, a second electrode Cb of the storage capacitor Cst, a first gate signal line SL1 and a second gate signal line SL2. For example, the first gate signal line SL1 extends along the first direction X, and the second gate signal line SL2 extends along the first direction X. For example, referring to FIG. 6, the first initialization signal line INT1 extends along the first direction X, and the second initialization signal line INT2 extends along the first direction X. The first initialization signal line INT1, the first gate signal line SL1, the second gate signal line SL2, and the second initialization signal line INT2 are arranged along the second direction Y. As illustrated by FIG. 6, the first gate signal line SL1 and the second gate signal line SL2 are located between the first initialization signal line INT1 and the second electrode Cb of the storage capacitor Cst. As illustrated by FIG. 6, the first initialization signal line INT1 and the second initialization signal line INT2 are located on both sides of the second electrode Cb of the storage capacitor Cst, the first initialization signal line INT1 and the second initialization signal line INT2 are located on both sides of the blocker BK, and the first gate signal line SL1, the second gate signal line SL2, the blocker BK and the second electrode Cb of the storage capacitor Cst are arranged between the first initialization signal line INT1 and the second initialization signal line INT2. As illustrated by FIG. 6, the first initialization signal line INT1, the first gate signal line SL1, the second gate signal line SL2, the blocker BK, the second electrode Cb of the storage capacitor Cst, and the second initialization signal line INT2 are sequentially arranged along the second direction Y.

As illustrated by FIG. 7, the third conductive pattern layer LY3 includes a power supply connection line VDD0, a first connection electrode CEa, a second connection electrode CEb, a third connection electrode CEc, a fourth connection electrode CEd, a fifth connection electrode CEe, a first connection line CL1 and a second connection line CL2. An interlayer insulating layer (interlayer insulating layer ILD, refer to FIG. 11) is provided between the third conductive pattern layer LY3 and the second conductive pattern layer LY2.

With reference to FIGS. 5 to 7, FIG. 9 and FIG. 10, the power supply connection line VDD0 is electrically connected with the first electrode T41 of the first light-emitting control transistor T4 through a via hole H2, the power supply connection line VDD0 is electrically connected with the second electrode Cb of the storage capacitor Cst through via holes H3 and H30, and the power supply connection line VDD0 is electrically connected with the conductive block BK through a via hole H0. One end of the first connection electrode CEa is electrically connected with the first initialization signal line INT1 through a via hole H12, and the other end of the first connection electrode CEa is electrically connected with the first electrode T61 of the first reset transistor T6 through a via hole H11, so that the first electrode T61 of the first reset transistor T6 is electrically connected with the first initialization signal line INT1. One end of the second connection electrode CEb is electrically connected with the second electrode T62 of the first reset transistor T6 through a via hole H22, and the other end of the second connection electrode CEb is electrically connected with the gate electrode T10 of the driving transistor T1 (i.e., the first electrode Ca of the storage capacitor Cst) through a via hole H21, so that the second electrode T62 of the first reset transistor T6 is electrically connected with the gate electrode T10 of the driving transistor T1 (i.e., the first electrode Ca of the storage capacitor Cst). One end of the third connection electrode CEc is electrically connected with the second initialization signal line INT2 through a via hole H32, and the other end of the third connection electrode CEc is electrically connected with the first electrode T71 of the second reset transistor T7 through a via hole H31, so that the first electrode T71 of the second reset transistor T7 is electrically connected with the second initialization signal line INT2. A fourth connection electrode CEd is electrically connected with a second electrode T52 of the second light-emitting control transistor T5 through a via hole H40. The fourth connection electrode CEd can be used to be connected with the sixth connection electrode CEf formed later, and then electrically connected with the first electrode 201 (refer to FIG. 9) of the light-emitting element 20. A fifth connection electrode CEe is electrically connected with a first electrode T21 of the data writing transistor T2 through a via hole H5. A fifth connection electrode CEe is used to be connected with the data line.

FIG. 8 shows a fourth conductive pattern layer LY4. The fourth conductive pattern layer LY4 includes a data line DT, a sixth connection electrode CEf, and a first power line VDD1. A passivation layer (passivation layer PVX, refer to FIG. 11) and a first planarization layer (first planarization layer PLN1, refer to FIG. 11) are provided between the third conductive pattern layer LY3 and the fourth conductive pattern layer LY4. The first power line VDD1 is connected with the power supply connection line VDD0 through a via hole H6 penetrating through the passivation layer and the first planarization layer, and the sixth connection electrode CEf is connected with the fourth connection electrode CEd through a via hole H7 penetrating through the passivation layer and the first planarization layer. A data line DT is connected with the fifth connection electrode CEe through a via hole H8, and then electrically connected with the first electrode T21 of the data writing transistor T2. For example, the sixth connection electrode CEf (connection electrode CEf) and the fourth connection electrode CEd (connection electrode CEd) constitute the connection element CE0. For example, the light-emitting element 20 is connected with the pixel circuit 10 through the connection element CE0. For example, the pixel circuit 10 is connected with a fourth connection electrode CEd (connection electrode CEd), the fourth connection electrode CEd is connected with a sixth connection electrode CEf (connection electrode CEf), and the sixth connection electrode CEf (connection electrode CEf) is connected with the light-emitting element 20.

FIG. 8 shows a first data line DT1, a second data line DT2, a third data line DT3 and a fourth data line DT4. FIG. 8 also shows positions of a first pixel unit 101a, a second pixel unit 101b, a third pixel unit 101c and a fourth pixel unit 101d. As illustrated by FIG. 8, the first data line DT1 is connected with the fifth connection electrode CEe at a corresponding position through a via hole H81, the second data line DT2 is connected with the fifth connection electrode CEe at a corresponding position through a via hole H82, the third data line DT3 is connected with the fifth connection electrode CEe at a corresponding position through a via hole H83, the fourth data line DT4 is connected with the fifth connection electrode CEe at a corresponding position through a via hole H84.

As illustrated by FIG. 9, in order to prevent the formation of the via holes from damaging the channel and affecting the performance of the data writing transistor T2, the orthographic projections of the first gate signal line SL1 and the second gate signal line SL2 on the base substrate do not overlap with the orthographic projection of the channel region T23 of the data writing transistor T2 on the base substrate.

As illustrated by FIG. 9, in order to avoid the formation of the via holes from damaging the channel and affecting the performance of the threshold compensation transistor T3, the orthographic projections of the first gate signal line SL1 and the second gate signal line SL2 on the base substrate do not overlap with the orthographic projection of the channel region T33 of the threshold compensation transistor on the base substrate.

As illustrated by FIGS. 8 and 9, the data line DT extends along the second direction Y, and the first data line DT1, the third data line DT3, the fourth data line DT4 and the second data line DT2 are arranged along the first direction X.

For example, the first power line VDD1 is configured to supply the first voltage signal ELVDD to the pixel circuit 10. The first power line VDD1 is connected with the blocker BK to provide a constant voltage to the blocker BK. The first power line VDD1 is connected with the first power supply terminal VDD, and the second electrode Cb of the storage capacitor Cst is connected with the first power line VDD1. For example, the second electrode Cb of the storage capacitor Cst is connected with the first power supply terminal VDD through the power supply connection line VDD0 and the first power line VDD1. FIG. 9 shows a plan view of the structure after forming the fourth conductive pattern layer LY4.

For example, the first electrode T41 of the first light-emitting control transistor T4 is connected with the first power supply terminal VDD through a power supply connection line VDD0 and a first power line VDD1 (refer to FIGS. 9 and 10).

As illustrated by FIG. 10, the threshold compensation transistor T3 is a double-gate transistor. The threshold compensation transistor T3 includes a first channel T331 and a second channel T332, and the first channel T331 and the second channel T332 are connected through a first conductive connection portion CP1. As illustrated by FIG. 10, the first reset transistor T6 is a double-gate transistor. The first reset transistor T6 includes a first channel T631 and a second channel T632. The first channel T631 and the second channel T632 are connected by a second conductive connection portion CP2.

As illustrated by FIG. 10, the blocker BK is configured to block the first conductive connection portion CP1 between the two channels of the threshold compensation transistor T3, and the blocker BK and the first conductive connection portion CP1 form a capacitor (stable capacitor) to avoid the leakage current of the threshold compensation transistor T3, and avoid affecting the display effect. As illustrated by FIG. 9, in the plan view, the blocker BK and the first conductive connection portion CP1 are partially overlapped.

As illustrated by FIG. 10, in the plan view, the first initialization signal line INT1 partially overlaps with the second conductive connection portion CP2, and a capacitance (stabilization capacitor) is formed between the first initialization signal line INT1 and the second conductive connection portion CP2 to avoid the leakage current of the first reset transistor T6, and avoid affecting the display effect.

Referring to FIG. 3 and FIG. 9, the first gate line GT1 is connected to the gate electrode of the data writing transistor T2 of the first pixel unit 101a; the second gate line GT2 is connected to the gate electrode of the data writing transistor T2 of the second pixel unit 101b.

Referring to FIG. 6 and FIG. 9, the first gate signal line SL1 extends along the first direction X, is connected to the first pixel unit 101a, and is configured to provide a first scan signal to the first pixel unit 101a; the second gate signal line SL2 extends along the first direction X, is connected to the second pixel unit 101b, and is configured to provide a second scan signal to the second pixel unit 101b.

Referring to FIG. 7 and FIG. 9, the first connection line CL1 extends in the second direction Y, the first gate line GT1 is connected to the first gate signal line SL1 through the first connection line CL1; the second connection line CL2 extends in the second direction Y, the second gate line GT2 is connected to the second gate signal line SL2 through the second connection line CL2.

The display panel provided by the embodiment of the present disclosure can achieve the dual gate & dual source technical solution at high resolution. In the display panel provided by the embodiments of the present disclosure, the horizontal wiring of the dual gate signal is realized through the second conductive pattern layer, and the connection lines in the third conductive pattern layer are respectively connected to the gate line in the first conductive pattern layer and the gate signal line in the second conductive pattern layer through via holes. The pixel layout structure is compact, which is beneficial to achieve high PPI. For example, in some embodiments, the application of the Dual source & Dual gate technical solution at a high resolution of 413 PPI (Pixel per Inch) is implemented.

For example, as illustrated by FIGS. 6 and 9, the first gate signal line SL1 and the second gate signal line SL2 are insulated from each other, so that scanning signals can be inputted to two adjacent columns of pixel units in the same row of pixel units, respectively. For example, the first gate signal line SL1 is used to input a scan signal to the pixel units in the odd-numbered column, and the second gate signal line SL2 is used to input a scan signal to the pixel units in the even-numbered column For example, as illustrated by FIGS. 5 and 9, the first gate line GT1 and the second gate line GT2 are separated from each other and arranged along the first direction X. For example, in the same row of pixel units, the second gate line GT2 is provided between two adjacent first gate lines GT1, and the first gate line GT1 is provided between two adjacent second gate lines GT2. For example, as illustrated by FIGS. 5 and 9, the first gate line GT1 extends in the first direction X, and the second gate line GT2 extends in the first direction X. In the embodiments of the present disclosure, the extension of a component in a certain direction refers to the overall extension trend of the component, and it is not necessary that every part of the component extends along the extension direction.

For example, as shown in FIGS. 7 and 9, the second gate signal line SL2 is closer to the first gate line GT1 than the first gate signal line SL1, and the length of the first connection line CL1 in the second direction Y is greater than that of the second connection line CL2 in the second direction Y.

For example, referring to FIGS. 5, 6, 7 and 9, the first gate line GT1, the first connection line CL1, and the first gate signal line SL1 are located in three different layers, and the second gate line GT2, the second connection line CL2 and the second gate signal line SL2 are located in three different layers.

For example, referring to FIG. 5, FIG. 6, FIG. 7 and FIG. 9, the first gate line GT1 and the second gate line GT2 are located in the same layer, the first connection line CL1 and the second connection line CL2 are located in the same layer, and the first gate signal line SL1 and the second gate signal line SL2 are located in the same layer.

For example, referring to FIG. 5, FIG. 6, FIG. 7, FIG. 9, FIG. 11, and FIG. 13, the first gate line GT1 and the second gate line GT2 are located in the first conductive pattern layer LY1; the first gate signal line SL1 and the second gate signal line SL2 are located in the second conductive pattern layer LY2; the first connection line CL1 and the second connection line CL2 are located in the third conductive pattern layer LY3; the first conductive pattern layer LY1 is closer to the base substrate BS than the second conductive pattern layer LY2, the second conductive pattern layer LY2 is closer to the base substrate BS than the third conductive pattern layer LY3.

For example, referring to FIGS. 11 and 13, the display panel further includes a first gate insulating layer GI1, a second gate insulating layer GI2, and an interlayer insulating layer ILD; the first conductive pattern layer LY1 is located on the first gate insulating layer GIL a second gate insulating layer GI2 is provided between the conductive pattern layer LY1 and the second conductive pattern layer LY2, the interlayer insulating layer ILD is located on the second conductive pattern layer LY2, and the third conductive pattern layer LY3 is located on the interlayer insulating layer ILD.

For example, referring to FIGS. 7 and 9, one end of the first connection line CL1 is connected to the first gate line GT1 through a first via hole V1 penetrating the second gate insulating layer GI2 and the interlayer insulating layer ILD, and the other end of the first connection line CL1 is connected to the first gate signal line SL1 through a second via hole V2 penetrating the interlayer insulating layer ILD; one end of the second connection line CL2 is connected with the second gate line GT2 through a third via hole V3 penetrating the second gate insulating layer GI2 and the interlayer insulating layer ILD, and the other end of the second connection line CL2 is connected to the second gate signal line SL2 through a fourth via V4 penetrating the interlayer insulating layer ILD.

For example, as illustrated by FIG. 9, the gate electrode of the threshold compensation transistor T3 of the first pixel unit 101a is connected to the first gate line GT1, and the gate electrode of the threshold compensation transistor T3 of the second pixel unit 101b is connected to the second gate line GT2. The first electrode of the threshold compensation transistor T3 is connected to the second electrode of the driving transistor T1, and the second electrode of the threshold compensation transistor T3 is connected to the gate electrode of the driving transistor T1.

For example, as illustrated by FIG. 9, the first gate signal line SL1 and the second gate signal line SL2 are located between the threshold compensation transistor T3 and the first reset transistor T6, so that the positions of the first gate signal line SL1 and the second gate signal line SL2 are defined in the second direction.

As illustrated by FIG. 8, the length of the sixth connection electrode CEf in the second direction Y is larger than a common connection electrode. As illustrated by FIG. 8, the length of the sixth connection electrode CEf in the second direction Y is larger than the length of the sixth connection electrode CEf in the first direction X. For example, the length of the sixth connection electrode CEf in the second direction Y is larger than 2-5 times of the length of the sixth connection electrode CEf in the first direction X. In some embodiments, the length of the sixth connection electrode CEf in the second direction Y is larger than 3, 4, or 5 times of the length of the sixth connection electrode CEf in the first direction X. The sixth connection electrode CEf shown in FIG. 8 may be called as a shielding portion CEs. The shielding portion CEs and the fourth connection electrode CEd (connection electrode CEd) constitute a connection element CE0.

Referring to FIGS. 7, 9 and 10, one end of the second connection electrode CEb is electrically connected with the gate electrode T10 of the driving transistor T1 (i.e., the first electrode Ca of the storage capacitor Cst) through a via hole H21, and the other end of the second connection electrode CEb is electrically connected with the second electrode T62 of the first reset transistor T6 through a via hole H22, the second connection electrode CEb can also be called as a third connection line CL3. As illustrated by FIG. 11, the gate electrode T10 of the driving transistor T1 is connected with the second electrode T32 of the threshold compensation transistor T3 through the third connection line CL3.

Referring to FIGS. 8, 9, and 10, the shielding portion CEs extends in the second direction Y. For example, the light-emitting element 20 is connected with the pixel circuit 10 through a connection element CE0 (including the fourth connection electrode CEd and the shielding portion CEs).

Referring to FIGS. 8 and 9, the data line DT and the shielding portion CEs are located in the same layer, and both the data line DT and the shielding portion CEs are located in the fourth conductive pattern layer LY4. The data line DT includes two adjacent data lines DT, and the shielding portion CEs is located between the two adjacent data lines DT, and the orthographic projection of the shielding portion CEs on the base substrate BS at least partially overlaps with the orthographic projection of the third connection line CL3 on the base substrate BS. Referring to FIGS. 8 and 9, the data line DT includes a first data line DT1 and a third data line DT3, which are adjacent to each other, and the shielding portion CEs is located between the first data line DT1 and the third data line DT3 in the first direction X. In an embodiment of the present disclosure, adjacent elements A and B refers to that there is neither element A nor element B between the elements A and B. The shielding portion CEs extends along the second direction and is located between two adjacent data lines DT, and the shielding effect is more obvious at the position where the distance between adjacent data lines is closer.

For example, in some embodiments, the orthographic projection of the third connection line CL3 on the base substrate BS completely falls within the orthographic projection of the shielding portion CEs on the base substrate BS.

For example, in some embodiments, referring to FIGS. 8 and 9, the orthographic projection of the first connection line CL1 on the base substrate BS and the orthographic projection of the shielding portion CEs on the base substrate BS do not overlap. Referring to FIGS. 8 and 9, the orthographic projection of the second connection line CL2 on the base substrate BS and the orthographic projection of the shielding portion CEs on the base substrate BS do not overlap.

As illustrated by FIG. 10, the display panel includes a first conductive structure CDT1, and the first conductive structure CDT1 is connected to the gate electrode T10 of the driving transistor T1.

For example, the material of the first conductive structure CDT1 is the same as the material of the first conductive connection portion CP1. For example, the first conductive structure CDT1 and the first conductive connecting portion CP1 can be made from the same film layer through the same process.

For example, the material of the first conductive structure CDT1 includes a conductive material obtained by doping a semiconductor material. For example, the material of the first conductive structure CDT1 includes a conductive material obtained by doping polysilicon, but is not limited thereto.

For example, as illustrated by FIG. 10, the first conductive structure CDT1 is multiplexed as the second electrode T62 of the first reset transistor T6. In the embodiment of the present disclosure, the first conductive structure CDT1 is used as the second electrode T62 of the first reset transistor T6 as an example for description.

For example, as illustrated by FIG. 10, the first conductive structure CDT1, the third connection line CL3, and the gate electrode T10 of the driving transistor T1 constitute the gate signal portion PT1 of the driving transistor T1.

For example, as illustrated by FIG. 10, the orthographic projection of the shielding portion CEs on the base substrate BS at least partially overlaps with the orthographic projection of the gate signal portion PT1 on the base substrate BS, so that the shielding portion CEs shields the parasitic capacitance between the gate signal portion PT1 and the data line, and reduces the longitudinal crosstalk problem.

In the embodiment of the present disclosure, the orthographic projection of the shielding portion CEs on the base substrate BS at least partially overlaps with the orthographic projection of the third connection line CL3 on the base substrate BS, so that the shielding portion CEs shields the parasitic capacitance between the gate signal portion PT1 (the gate electrode point) and the data line, so as to reduce the longitudinal crosstalk problem.

For example, the 120 Hz driving scheme adopts the time-sharing writing method, that is, the data signal is stored in the storage capacitor first, and then the scanning signal is turned on and then written into the pixel unit. The interference between the data signals will affect the accurate writing of the data signal and the display effect. In the embodiment of the present disclosure, the shielding portion CEs is located between two adjacent data lines DT, and the orthographic projection of the third connection line CL3 on the base substrate BS at least partially overlaps with the orthographic projection of the shielding portion CEs on the base substrate BS, which can well reduce the coupling effect and improve this problem.

For example, as illustrated by FIG. 9 and FIG. 10, in order to minimize the longitudinal crosstalk to a great extent, the orthographic projection of the shielding portion CEs on the base substrate BS is larger than that of the third connection line CL3 on the base substrate BS. For example, the area of the orthographic projection of the shielding portion CEs on the base substrate BS is larger than the area of the orthographic projection of the third connection line CL3 on the base substrate BS. For example, the orthographic projection of the shielding portion CEs on the base substrate BS covers the orthographic projection of the third connection line CL3 on the base substrate BS. For example, in the plan view, the shielding portion CEs covers the third connection line CL3. For example, as illustrated by FIGS. 9 and 10, the main surface of the base substrate BS is a surface for manufacturing each component, and each component is provided on the main surface of the base substrate BS.

For example, in order to reduce the longitudinal crosstalk to a great extent, the orthographic projection of the gate electrode T10 of the driving transistor T1 on the base substrate BS partially overlaps with the orthographic projection of the shielding portion CEs on the base substrate BS, and the overlapping area of the shielding portion CEs and the gate electrode T10 of the driving transistor T1 is smaller than that of the gate electrode T10 of the driving transistor T1.

For example, as illustrated by FIG. 9 and FIG. 10, in order to improve the display quality, the size of the gate electrode T10 of the driving transistor T1 in the first direction X is larger than that of the shielding portion CEs in the first direction X; the size of the shielding portion CEs in the second direction Y is larger than the size of the gate electrode of the driving transistor T1 in the second direction Y.

For example, as illustrated by FIG. 9 and FIG. 10, the gate electrode T10 of the driving transistor T1 respectively exceeds the shielding portion CEs from both sides in the first direction X.

For example, as illustrated by FIG. 9 and FIG. 10, the orthographic projection of the shielding portion CEs on the base substrate BS overlaps with the orthographic projection of the gate line GT on the base substrate BS. The gate line GT may include the first gate line GT1 and the second gate line GT2.

For example, as illustrated by FIG. 9, the orthographic projection of the first gate line GT1 or the second gate line GT2 on the base substrate BS partially overlaps with the orthographic projection of the shielding portion CEs on the base substrate BS.

For example, the pixel unit includes two adjacent pixel units located in the same column, and two adjacent data lines DT are respectively connected with the two pixel units. FIG. 9 shows the positions of a first pixel unit 101a, a second pixel unit 101b, a third pixel unit 101c and a fourth pixel unit 101d.

For example, as illustrated by FIG. 9 and FIG. 10, the second electrode T62 of the first reset transistor T6 is connected with the gate electrode T10 of the driving transistor T1 through a third connection line CL3. As described above, the second electrode T62 of the first reset transistor T6 is integrally formed with the second electrode T32 of the threshold compensation transistor T3, so that the second electrode T32 of the threshold compensation transistor T3 is connected with the gate electrode T10 of the driving transistor T1.

For example, as illustrated by FIG. 9 and FIG. 10, the orthographic projection of the shielding portion CEs on the base substrate BS at least partially overlaps with the orthographic projection of the second electrode T62 of the first reset transistor T6 on the base substrate BS. In the same way, because the second electrode T62 of the first reset transistor T6 is integrally formed with the second electrode T32 of the threshold compensation transistor T3, the orthographic projection of the shielding portion CEs on the base substrate BS at least partially overlaps with the orthographic projection of the second electrode T32 of the threshold compensation transistor T3 on the base substrate BS.

For example, as illustrated by FIG. 9 and FIG. 10, the orthographic projection of the shielding portion CEs on the base substrate BS does not overlap with the orthographic projection of the second gate signal line SL2 on the base substrate BS, so that the upper end position of the shielding portion CEs in the second direction Y is defined.

For example, referring to FIGS. 9 and 10, the first initialization signal line INT1 and the second initialization signal line INT2 are respectively arranged on opposite sides of the gate electrode T10 of the driving transistor T1, and the orthographic projection of the shielding portion CEs on the base substrate BS partially overlaps with the orthographic projection of the second initialization signal line INT2 on the base substrate BS.

Further, for example, the orthographic projection of the second initialization signal line INT2 on the base substrate BS overlaps with the orthographic projection of the second conductive connection CP2 of the next row of pixel units on the base substrate BS, so that a capacitor is formed between the second initialization signal line INT2 and the shielding portion CEs, which acts as a stabilization capacitor to reduce the leakage current of the first reset transistor T6.

For example, referring to FIG. 9, the first reset control signal line RT1 and the second reset control signal line RT2 are respectively arranged on opposite sides of the gate electrode T10 of the driving transistor T1, and referring to FIG. 9, the orthographic projection of the second reset control signal line RT2 on the base substrate BS and the orthographic projection of the shielding portion CEs on the base substrate BS do not overlap with each other. Thereby, the lower end position of the shielding portion CEs in the second direction Y is defined.

For example, referring to FIG. 9 and FIG. 10, the orthographic projection of the first reset control signal line RT1 on the base substrate BS and the orthographic projection of the shielding portion CEs on the base substrate BS do not overlap with each other.

For example, referring to FIG. 9 and FIG. 10, the first reset control signal line extends along the first direction X, and the second reset control signal line extends along the first direction X.

In FIG. 9, each sixth connection electrode CEf is connected with one light-emitting element, that is, each sixth connection electrode CEf corresponds to one pixel unit 101. Or, in FIG. 9, each shielding portion CEs is connected with one light-emitting element, that is, each shielding portion CEs corresponds to one pixel unit 101.

For example, referring to FIG. 9, the orthographic projection of the first gate electrode T601 and the second gate electrode T602 of the first reset transistor T6 on the base substrate BS overlaps with the orthographic projection of the first channel T631 and the second channel T632 of the first reset transistor T6 on the base substrate BS, respectively. For example, referring to FIG. 9, the orthographic projections of the first gate electrode T301 and the second gate electrode T302 of the threshold compensation transistor T3 on the base substrate BS overlap with the orthographic projection of the first channel T331 and the second channel T332 of the threshold compensation transistor T3 on the base substrate BS, respectively.

For example, as illustrated by FIG. 9, the first power line VDD1 is connected with the second electrode Cb of the storage capacitor Cst through the power supply connection line VDD0.

In the conventional technology, the threshold compensation transistor T3 is a double-gate transistor, and the intermediate node (the first conductive connection portion CP1) of the threshold compensation transistor T3 is disturbed by the jump of the scanning signal, and the voltage increases at the moment when the scanning signal is turned off, so that the leakage to the gate electrode of the driving transistor T1 is intensified, which may lead to a flicker problem.

For example, referring to FIG. 9, in order to reduce the leakage of the threshold compensation transistor T3, the orthographic projection of the blocker BK on the base substrate BS at least partially overlaps with the orthographic projection of the first conductive connection CP1 on the base substrate BS. A stabilization capacitance is formed between the blocker BK and the first conductive connecting portion CP1. Increasing the parasitic capacitance between the intermediate node of the threshold compensation transistor T3 and the first voltage signal ELVDD can reduce the disturbance and improve the leakage problem.

The pixel circuit is formed on the base substrate to form the display panel shown in FIG. 9 or FIG. 10, and the light-emitting element is formed on the basis of the display panel shown in FIG. 9 or FIG. 10 to obtain a display panel capable of displaying, so that the pixel circuit is closer to the base substrate than the light-emitting element. As illustrated by FIG. 13, the pixel circuit 10 is closer to the base substrate BS than the light-emitting element 20.

FIG. 12 shows a first electrode 201 of the light-emitting element 20. FIG. 13 is a cross-sectional view of a display panel provided by an embodiment of the present disclosure. The film layers above the first electrode 201 of the light-emitting element is omitted in FIG. 12. The film layers above the first electrode 201 of the light-emitting element 20 can refer to the cross-sectional view. Of course, the arrangement position and shape of the first electrode 201 of the light-emitting element are not limited to those shown in FIG.

12, and those skilled in the art can adjust the arrangement position and shape of the first electrode 201 of the light-emitting element as needed.

Referring to FIGS. 12 and 13, a buffer layer BL is located on a substrate BS, an isolation layer BR is located on the buffer layer BL, and a channel region, a source electrode and a drain electrode of a transistor are located on the isolation layer BR. A first gate insulating layer GI1 is formed on the channel region, the source electrode and the drain electrode of the transistor, a first conductive pattern layer LY1 is located on the first gate insulating layer GI1, and a second gate insulating layer GI2 is located on the first conductive pattern layer LY1; a second conductive pattern layer LY2 is located on the second gate insulating layer GI2, an interlayer insulating layer ILD is located on the second conductive pattern layer LY2, a third conductive pattern layer LY3 is located on the interlayer insulating layer ILD, a passivation layer PVX is located on the first conductive pattern layer LY, a first planarization layer PLN1 is located on the passivation layer PVX, and a fourth conductive pattern layer LY4 is located on the first planarization layer PLN1.

With reference to FIG. 13, the second planarization layer PLN2 is located on the fourth conductive pattern layer LY4, the first electrode 201 of the light-emitting element 20 is located on the second planarization layer PLN2, and a pixel definition layer PDL and a spacer PS are located on the second planarization layer PLN2. The pixel definition layer PDL includes an opening OPN configured to define the light-emitting area (light-exiting area, effective light-emitting area) of the pixel unit. The spacer PS is configured to support a fine metal mask when forming the light-emitting functional layer 203.

For example, as illustrated by FIG. 12 and FIG. 13, the opening OPN is the light-emitting region of the pixel unit. The light-emitting functional layer 203 is located on the first electrode 201 of the light-emitting element 20, and the second electrode 202 of the light-emitting element 20 is located on the light-emitting functional layer 203, and an encapsulation layer CPS is located on the light-emitting element 20. The encapsulation layer CPS includes a first encapsulation layer CPS1, a second encapsulation layer CPS2 and a third encapsulation layer CPS3. For example, the first encapsulation layer CPS1 and the third encapsulation layer CPS3 are inorganic material layers, and the second encapsulation layer CPS2 is an organic material layer. For example, the first electrode 201 is the anode of the light-emitting element 20, and the second electrode 202 is the cathode of the light-emitting element 20, but embodiments of the present disclosure are not limited thereto.

As illustrated by FIGS. 12 and 13, the first electrode 201 of the light-emitting element 20 is connected with the shielding portion CEs (the sixth connection electrode CEf) through a via hole H9 penetrating through the second planarization layer PLN2.

For example, the light-emitting element 20 includes an organic light-emitting diode. The light-emitting functional layer 203 is located between the second electrode 202 and the first electrode 201. The second electrode 202 is located on a side of the first electrode 201 away from the base substrate BS, and the light-emitting functional layer 203 at least includes a light-emitting layer, and may also include at least one of a hole transport layer, a hole injection layer, an electron transport layer and an electron injection layer.

As illustrated by FIG. 6 and FIG. 13, the second electrode Cb of the storage capacitor has an opening OPN1, and the setting of the opening OPN1 facilitates the connection between the second connection electrode CEb and the gate electrode T10 of the driving transistor T1.

For example, the transistors in the pixel circuit of the embodiment of the present disclosure are all thin film transistors. For example, the first conductive pattern layer LY1, the second conductive pattern layer LY2, the third conductive pattern layer LY3, and the fourth conductive pattern layer LY4 are all made of metal materials. For example, the first conductive pattern layer LY1 and the second conductive pattern layer LY2 are formed of metal materials such as nickel and aluminum, but are not limited thereto. For example, the third conductive pattern layer LY3 and the fourth conductive pattern layer LY4 are formed of materials such as titanium and aluminum, but are not limited thereto. For example, the third conductive pattern layer LY3 and the fourth conductive pattern layer LY4 have a structure formed by three sub-layers of Ti/AL/Ti, respectively, but are not limited thereto. For example, the base substrate can be a glass substrate or a polyimide substrate, but is not limited thereto, and can be selected as required. For example, the first gate insulating layer GI1, the second gate insulating layer GI2, the interlayer insulating layer ILD, the passivation layer PVX, the first planarization layer PLN1, the second planarization layer PLN2, the pixel definition layer PDL, and the spacer PS are all made of insulating materials. Materials of the first electrode 201 and the second electrode 202 of the light-emitting element can be selected as required. In some embodiments, the first electrode 201 may adopt at least one of transparent conductive metal oxide and silver, but is not limited thereto. For example, the transparent conductive metal oxide includes indium tin oxide (ITO), but is not limited thereto. For example, the first electrode 201 may adopt a structure in which ITO-Ag-ITO is stacked in three sub-layers. In some embodiments, the second electrode 202 may be a metal with low work function, and at least one of magnesium and silver may be used, but is not limited thereto.

In the display panel provided by the embodiment of the present disclosure, the blocker BK having the structure shown in FIG. 12 may not be provided, but the connection electrode with a relatively small length in the second direction is adopted. That is, the sixth connection electrode CEf/the shielding portion CEs may adopt other sizes and shapes.

In the embodiments of the present disclosure, the data writing transistor T2 can be called as the first transistor, and the threshold compensation transistor T3 can be called as the second transistor.

For example, in the case where the threshold compensation transistor T3 and the first reset transistor T6 directly connected to the gate electrode of the driving transistor T1 are metal oxide semiconductor thin film transistors (using the LTPO technology), at least one of the first gate signal line SL1 and the second gate signal line SL2 can output the turn-on signal of the n-type transistor; the film layer selected for the first gate line GT1 and the second gate line GT2 is not limited to the first conductive pattern layer LY1, the film layer selected for the first gate signal line SL1 and the second gate signal line SL2 is not limited to the second conductive pattern layer LY2, but can also be other metal film layers, such as the metal film layer above the second conductive pattern layer LY2, for example, the third conductive pattern layer LY3. The film layer can simultaneously serve as the gate electrode of an oxide TFT, and the like; an oxide semiconductor can also be used as the connection line, or a transition structure, etc. through a conduction process.

At least one embodiment of the present disclosure also provides a display device, which comprises any one of the above display panels. For example, the display device includes OLEDs or products driven at high frame rates including OLEDs. For example, the display device includes any products or components with display functions such as televisions, digital cameras, mobile phones, watches, tablet computers, notebook computers, navigators, etc.

The above description takes the pixel circuit of 7T1C as an example, and embodiments of the present disclosure include but are not limited thereto. It should be noted that the embodiment of the present disclosure does not limit the number of thin film transistors and the number of capacitors included in the pixel circuit. For example, in other embodiments, the pixel circuit of the display panel may also be a structure including other numbers of transistors, such as 7T2C structure, 6T1C structure, 6T2C structure or 9T2C structure, which is not limited by the embodiments of the present disclosure.

In an embodiment of the present disclosure, elements located in the same layer can be formed by the same film layer and the same patterning process. For example, components located on the same layer may be located on the surface of the same component away from the base substrate.

It should be noted that the thicknesses of layers or regions are exaggerated in the drawings for describing embodiments of the present disclosure for the sake of clarity. It can be understood that when an element such as a layer, film, region or substrate is described to be located "on" or "under" another element, the element may be "directly" located "on" or "under" another element, or there may be intermediate elements.

In an embodiment of the present disclosure, the patterning or patterning process may include only a photolithography process, or a photolithography process and an etching step, or may include printing, ink-jet and other processes for forming a predetermined pattern. The photolithography process refers to a process including film formation, exposure and development, which uses photoresist, mask plate and exposure machine to form a pattern. The corresponding patterning process can be selected according to the structure formed in the embodiments of the present disclosure.

In case of no conflict, features in one embodiment or in different embodiments of the present disclosure can be combined.

The foregoing are only the specific embodiments of the disclosure, but the protection scope of the disclosure is not limited thereto. Any changes or substitutions which can be easily conceived by those skilled in the art within the technical scope disclosed in the disclosure should be covered within the protection scope of the disclosure. Therefore, the protection scope of the present disclosure should be based on the protection scope of the claims.

The invention claimed is:

1. A display panel, comprising:
   a pixel unit, comprising a pixel circuit and a light-emitting element, wherein the pixel circuit is configured to drive the light-emitting element, the pixel circuit comprises a first transistor, the pixel unit comprises a first pixel unit and a second pixel unit located in a same row and adjacent columns;
   a first gate line, connected to a gate electrode of the first transistor of the first pixel unit;
   a second gate line, connected to the gate electrode of the first transistor of the second pixel unit;
   a first gate signal line, extending along a first direction, connected to the first pixel unit and configured to provide a first scanning signal to the first pixel unit;
   a second gate signal line, extending along the first direction, connected to the second pixel unit and configured to provide a second scanning signal to the second pixel unit;
   a first connection line, extending along a second direction, wherein the first gate line is connected with the first gate signal line through the first connection line; and
   a second connection line, extending along the second direction, wherein the second gate line is connected with the second gate signal line through the second connection line, and the second direction intersects with the first direction,
   wherein the first gate line, the first connection line and the first gate signal line are located in three different layers, and the second gate line, the second connection line and the second gate signal line are located in three different layers.

2. The display panel according to claim 1, wherein the first gate signal line and the second gate signal line are insulated from each other.

3. The display panel according to claim 1, wherein the first gate line and the second gate line are separated from each other and arranged along the first direction.

4. The display panel according to claim 1, wherein the second gate signal line is closer to the first gate line than the first gate signal line.

5. The display panel according to claim 1, wherein orthographic projections of the first gate signal line and the second gate signal line on the base substrate do not overlap with an orthographic projection of a channel region of the first transistor on the base substrate.

6. The display panel according to claim 1, wherein the first gate line and the second gate line are located in the same layer, the first connection line and the second connection line are located in the same layer, and the first gate signal line and the second gate signal line are located in the same layer.

7. The display panel according to claim 1, wherein
   the first gate line and the second gate line are located in a first conductive pattern layer;
   the first gate signal line and the second gate signal line are located in a second conductive pattern layer;
   the first connection line and the second connection line are located in a third conductive pattern layer;
   the first conductive pattern layer is closer to the base substrate than the second conductive pattern layer, and the second conductive pattern layer is closer to the base substrate than the third conductive pattern layer.

8. The display panel according to claim 1, further comprising a first gate insulating layer, a second gate insulating layer and an interlayer insulating layer,
   wherein a first conductive pattern layer is located on the first gate insulating layer, the second gate insulating layer is arranged between the first conductive pattern layer and a second conductive pattern layer, the interlayer insulating layer is located on the second conductive pattern layer, and a third conductive pattern layer is located on the interlayer insulating layer;
   one end of the first connection line is connected to the first gate line through a first via hole penetrating the second gate insulating layer and the interlayer insulating layer, and the other end of the first connection line is connected to the first gate signal line through a second via hole penetrating the interlayer insulating layer;

one end of the second connection line is connected to the second gate line through a third via hole penetrating the second gate insulating layer and the interlayer insulating layer, and the other end of the second connection line is connected to the second gate signal line through a fourth via hole penetrating the interlayer insulating layer.

9. The display panel according to claim 8, wherein the pixel circuit further comprises a driving transistor and a second transistor;
   a gate electrode of the second transistor of the first pixel unit is connected to the first gate line, and the gate electrode of the second transistor of the second pixel unit is connected to the second gate line,
   a first electrode of the second transistor is connected with a second electrode of the driving transistor, and a second electrode of the second transistor is connected with a gate electrode of the driving transistor.

10. The display panel according to claim 9, further comprising a first power supply terminal and a data line, wherein the first power supply terminal is configured to provide a first voltage signal to the pixel circuit, and the data line is configured to provide a data signal to the pixel circuit;
    wherein the pixel circuit further comprises a storage capacitor; a first electrode of the first transistor is connected with the data line, and a first electrode of the driving transistor is connected with a second electrode of the first transistor;
    a first electrode of the storage capacitor is connected with the gate electrode of the driving transistor, and a second electrode of the storage capacitor is connected with the first power supply terminal.

11. The display panel according to claim 9, wherein orthographic projections of the first gate signal line and the second gate signal line on the base substrate do not overlap with an orthographic projection of a channel region of the second transistor on the base substrate.

12. The display panel according to claim 9, further comprising an initialization signal line, wherein the initialization signal line is configured to provide an initialization signal to the pixel circuit,
    the pixel circuit further comprises a first reset transistor;
    a first electrode of the first reset transistor is connected to the initialization signal line, and a second electrode of the first reset transistor is connected to the gate electrode of the driving transistor.

13. The display panel according to claim 12, wherein the first gate signal line and the second gate signal line are located between the second transistor and the first reset transistor.

14. The display panel according to claim 9, wherein the pixel unit further comprises a third pixel unit located in the same column as the first pixel unit, and a data line comprises a first data line, a second data line and a third data line, the first data line is connected to the first pixel unit, the second data line is connected to the second pixel unit and the third data line is connected to the third pixel unit.

15. The display panel according to claim 9, wherein the pixel unit further comprises a fourth pixel unit located in the same column as the second pixel unit, and a data line comprises a fourth data line connected to the fourth pixel unit.

16. The display panel according to claim 1, further comprising a connection element, wherein the light-emitting element is connected to the pixel circuit through the connection element, and the connection element comprises a shielding portion extending along the second direction;
    a data line and the shielding portion are located in the same layer, and the data line comprises two adjacent data lines, and the shielding portion is located between the two adjacent data lines, and an orthographic projection of the first connection line on the base substrate does not overlap with an orthographic projection of the shielding portion on the base substrate.

17. The display panel according to claim 16, wherein the pixel circuit comprises a driving transistor and a second transistor, a first electrode of the second transistor is connected with a second electrode of the driving transistor, and a second electrode of the second transistor is connected with a gate electrode of the driving transistor;
    the display panel further comprises a third connection line, the gate electrode of the driving transistor is connected with the second electrode of the second transistor through the third connection line;
    an area of an orthographic projection of the shielding portion on the base substrate is larger than an area of an orthographic projection of the third connection line on the base substrate.

18. The display panel according to claim 16, wherein an orthographic projection of a gate electrode of a driving transistor on the base substrate overlaps with an orthographic projection of the shielding portion on the base substrate, and an area of an overlapping portion of the shielding portion and the gate electrode of the driving transistor is smaller than an area of the gate electrode of the driving transistor.

19. The display panel according to claim 16, wherein a size of a gate electrode of a driving transistor in the first direction is larger than a size of the shielding portion in the first direction; a size of the shielding portion in the second direction is larger than a size of the gate electrode of the driving transistor in the second direction; the orthographic projection of the shielding portion on the base substrate overlaps with the orthographic projection of the first gate line or the second gate line on the base substrate.

20. A display panel, comprising:
    a pixel unit, comprising a pixel circuit and a light-emitting element, wherein the pixel circuit is configured to drive the light-emitting element, the pixel circuit comprises a first transistor, the pixel unit comprises a first pixel unit and a second pixel unit located in a same row and adjacent columns;
    a first gate line, connected to a gate electrode of the first transistor of the first pixel unit;
    a second gate line, connected to the gate electrode of the first transistor of the second pixel unit;
    a first gate signal line, extending along a first direction, connected to the first pixel unit and configured to provide a first scanning signal to the first pixel unit;
    a second gate signal line, extending along the first direction, connected to the second pixel unit and configured to provide a second scanning signal to the second pixel unit;
    a first connection line, extending along the second direction, wherein the first gate line is connected with the first gate signal line through the first connection line; and
    a second connection line, extending along a second direction, wherein the second gate line is connected with the second gate signal line through the second connection line, and the second direction intersects with the first direction,
    the display panel further comprising a connection element, wherein the light-emitting element is connected to the pixel circuit through the connection element, and the connection element comprises a shielding portion extending along the second direction;

a data line and the shielding portion are located in the same layer, and the data line comprises two adjacent data lines, and the shielding portion is located between the two adjacent data lines, and an orthographic projection of the first connection line on the base substrate does not overlap with an orthographic projection of the shielding portion on the base substrate.

21. A display panel, comprising:

a pixel unit, comprising a pixel circuit and a light-emitting element, wherein the pixel circuit is configured to drive the light-emitting element, the pixel circuit comprises a first transistor, the pixel unit comprises a first pixel unit and a second pixel unit located in a same row and adjacent columns;

a first gate line, connected to a gate electrode of the first transistor of the first pixel unit;

a second gate line, connected to the gate electrode of the first transistor of the second pixel unit;

a first gate signal line, extending along a first direction, connected to the first pixel unit and configured to provide a first scanning signal to the first pixel unit;

a second gate signal line, extending along the first direction, connected to the second pixel unit and configured to provide a second scanning signal to the second pixel unit;

a first connection line, extending along a second direction, wherein the first gate line is connected with the first gate signal line through the first connection line; and a second connection line, extending along the second direction, wherein the second gate line is connected with the second gate signal line through the second connection line, and the second direction intersects with the first direction, wherein the second gate signal line is closer to the first gate line than the first gate signal line, a length of the first connection line in the second direction is greater than that of the second connection line in the second direction, the first gate signal line, the second gate signal line and the first gate line are arranged at intervals in the second direction and arranged in sequence.

* * * * *

UNITED STATES PATENT AND TRADEMARK OFFICE
CERTIFICATE OF CORRECTION

| | | |
|---|---|---|
| PATENT NO. | : 11,925,082 B2 | Page 1 of 1 |
| APPLICATION NO. | : 17/621861 | |
| DATED | : March 5, 2024 | |
| INVENTOR(S) | : Li et al. | |

It is certified that error appears in the above-identified patent and that said Letters Patent is hereby corrected as shown below:

On the Title Page

In Column 1, item (73), please change:
"Assignee: BOE TECHNOLOGY GROUP, CP., LTD., Beijing (CN)"
To correctly read:
-- Assignee: BOE TECHNOLOGY GROUP, CO., LTD., Beijing (CN) --

And

In Column 1, Add item (30) Foreign Application Priority Data after item (65) Prior Publication Data to read:
-- (30) Foreign Application Priority Data
December 28, 2020 (WO) ..........................PCT/CN2020/140199 --

Signed and Sealed this
Ninth Day of April, 2024

Katherine Kelly Vidal
*Director of the United States Patent and Trademark Office*